(12) United States Patent
Chin et al.

(10) Patent No.: US 10,403,783 B2
(45) Date of Patent: Sep. 3, 2019

(54) NANOSTRUCTURED SUBSTRATES FOR IMPROVED LIFT-OFF OF III-V THIN FILMS

(71) Applicants: Alan Chin, Mountain View, CA (US); Cun-Zheng Ning, Chandler, AZ (US)

(72) Inventors: Alan Chin, Mountain View, CA (US); Cun-Zheng Ning, Chandler, AZ (US)

(73) Assignee: Arizona Board of Regents on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 16/261,027

(22) Filed: Jan. 29, 2019

(65) Prior Publication Data

US 2019/0172966 A1    Jun. 6, 2019

Related U.S. Application Data

(63) Continuation of application No. PCT/US2017/047213, filed on Aug. 16, 2017.
(Continued)

(51) Int. Cl.
*H01L 31/18* (2006.01)
*H01L 21/02* (2006.01)
(Continued)

(52) U.S. Cl.
CPC .... *H01L 31/1896* (2013.01); *H01L 21/02455* (2013.01); *H01L 21/02513* (2013.01); *H01L 21/02639* (2013.01); *H01L 21/3086* (2013.01); *H01L 31/035281* (2013.01); *H01L 31/046* (2014.12); *H01L 31/184* (2013.01); *H01L 21/0265* (2013.01); *H01L 21/02381* (2013.01); *H01L 31/1844* (2013.01); *Y02E 10/544* (2013.01)

(58) Field of Classification Search
CPC ......... H01L 21/02381; H01L 21/02455; H01L 21/02513; H01L 21/02639; H01L 21/0265; H01L 21/3086; H01L 31/035281; H01L 31/046; H01L 31/184; H01L 31/1844; H01L 31/1896
See application file for complete search history.

(56) References Cited

U.S. PATENT DOCUMENTS 9,267,076 B2   2/2016   Ning et al.
9,589,793 B2   3/2017   Ning et al.
(Continued)

FOREIGN PATENT DOCUMENTS

KR   1020160007997 A   1/2016
WO   2010054231 A1     5/2010
(Continued)

OTHER PUBLICATIONS

O.D. Miller, E. Yablonovitch, and S.R. Kurtz, "Strong Internal and External Luminescence as Solar Cells Approach the Shockley-Queisser Limit," IEEE J. Photovolt. 2 (3), 303-311 (2012).
(Continued)

*Primary Examiner* — Jaehwan Oh
(74) *Attorney, Agent, or Firm* — Snell & Wilmer L.L.P.

(57) ABSTRACT

Reusable nanostructured substrates for forming semiconductor thin films, such as those used in solar cells, are configured with nanopillars to permit improved lift-off of thin films.

14 Claims, 22 Drawing Sheets

Related U.S. Application Data

(60) Provisional application No. 62/376,148, filed on Aug. 17, 2016.

(51) Int. Cl.
  H01L 21/308 (2006.01)
  H01L 31/046 (2014.01)
  H01L 31/0352 (2006.01)

(56) References Cited

U.S. PATENT DOCUMENTS

| | | | |
|---|---|---|---|
| 2010/0279886 A1* | 11/2010 | Fauchet | G01N 21/7743 506/9 |
| 2012/0192934 A1 | 8/2012 | Fan | |
| 2012/0192939 A1 | 8/2012 | Tamboli | |
| 2012/0318324 A1 | 12/2012 | Ning et al. | |
| 2012/0322164 A1* | 12/2012 | Lal | B82Y 10/00 436/501 |
| 2013/0143407 A1* | 6/2013 | Lin | B81C 1/0038 438/694 |
| 2013/0320503 A1* | 12/2013 | Nuzzo | H01L 29/04 257/618 |
| 2014/0011013 A1* | 1/2014 | Jin | B05D 5/08 428/297.4 |
| 2014/0140054 A1* | 5/2014 | Hashimura | C23C 14/046 362/231 |
| 2014/0166100 A1 | 6/2014 | Watanabe | |
| 2014/0286367 A1 | 9/2014 | Scofield et al. | |
| 2016/0118249 A1* | 4/2016 | Sreenivasan | H01L 21/02381 438/699 |
| 2017/0032862 A1* | 2/2017 | Kwon | G21G 1/04 |
| 2017/0356843 A1* | 12/2017 | Alu | G01N 21/554 |
| 2018/0083064 A1 | 3/2018 | Ning et al. | |

FOREIGN PATENT DOCUMENTS

| | | |
|---|---|---|
| WO | 2013184203 A1 | 12/2013 |
| WO | 2017030632 A2 | 2/2017 |

OTHER PUBLICATIONS

W. Choi, C. Z. Kim, C. S. Kim, et al., "A Repeatable Epitaxial Lift-Off Process from as Single GaAs Substrate for Low-Cost and High-Efficiency III-V Solar Cells," Adv. Energy Mater. 4 (16), 1400589 (2014).

G.P. Dimitrakopulos, C. Bazioti, J. Grym, et al., "Misfit dislocation reduction in InGaAs epilayers grown on porous GaAs substrates," Appl. Surf. Sci. 306, 89-93 (2014).

J. Grym, D. Nohavica, P. Gladkov et al., "Epitaxial growth on poruos GaAs substrates," C.R. Chim. 16 (1), 59-64 (2013).

Xiaolu Koua and M.S. Goorskya, "Development of Porous InP for Subsequent Epitaxial Layer Transfer onto Flexible Substrates," ECS Trans. 50 (7), 325, 330 (2013).

Xiangtian Yin, Corsin Battaglia, Yongjing Lin, et al., "19.2% Efficient InP Heterojunction Solar Cell with Electron-Selective TiO2 Contact," ACS Photonics 1 (12), 1245-1250 (2014).

Zhuang, X. et al., "Composition and Bandgap-Graded Semiconductor Alloy Nanowires", Advanced Materials, Jan. 2012 [available online Nov. 2011], vol. 24, No. 1, pp. 13-33 <DOI:10.1002/adma.201103191>.

Advances in the Theory of III-V Nanowire Growth Dynamics Peter Krogstrup, Henrik I. Jørgensen, Erik Johnson, Morten Hannibal Madsen, Claus B. Sørensen, Anna Fontcuberta i Morral, Martin Aagesen, Jesper Nygård, and Frank Glas.

Atomic-Scale Variability and Control of III-V Nanowire Growth Kinetics Y.-C. Chou, K. Hillerich, J. Tersoff, M. C. Reuter, K. A. Dick, F. M. Ross Science vol. 343, Issue 6168, pp. 281-284 (Jan. 17, 2014).

Synthesis and Characterizations of Ternary InGaAs Nanowires by a Two-Step Growth Method for High-Performance Electronic Devices Jared J. Hou, Ning Han, Fengyun Wang, Fei Xiu, SenPo Yip, Alvin T. Hui, TakFu Hung, and Johnny C. Ho ACS Nano, 2012, 6 (4), pp. 3624-3630.

Chen K, Kapadia R, Harker A, et al. Direct growth of single-crystalline III-V semiconductors on amorphous substrates. Nature Communications. 2016;7:10502. doi:10.1038/ncomms10502.

Hersee, S. et al., "Nanoheteroepitaxial growth of GaN on Si nanopillar arrays", Journal of Applied Physics, Apr. 2005, vol. 97, article 124308, 5 pages <DOI:10.1063/1.1937468>.

Kang, D. et al., "Shape-Controllable Microlens Arrays via Direct Transfer of Photocurable Polymer Droplets", Advanced Materials, Mar. 2012, vol. 24, No. 13, pp. 1709-1715 <DOI:10.1002/adma.201104507>.

Lee, M. et al., "A Hybrid Piezoelectric Structure for Wearable Nanogenerators", Advanced Materials, Mar. 2012, vol. 24, No. 13, pp. 1759-1764 <DOI:10.1002/adma.201200150>.

Miao, G. et al., "Stages in the catalyst-free InP nanowire growth on silicon (100) by metal organic chemical vapor deposition", Nanoscale Research Letters, Jun. 2012, vol. 7, article 321, 6 pages <DOI:10.1186/1556-276X-7-321>.

NG, K. et al., "Single Crystalline InGaAs Nanopillar Grown on Polysilicon with Dimensions beyond the Substrate Grain Size Limit", Nano Letters, Nov. 2013, vol. 13, No. 12, pp. 5931-5937 <DOI:10.1021/nl403555z>.

NG, K., "III-V Nanostructures on Dissimilar Substrates for Optoelectronic Applications", University of California Berkeley, Tehnical Report No. UCB/EECS-2014-196, Dec. 2014 [retrieved Jul. 6, 2019], 150 pages, retrieved from the internet: <URL:https://www2.eecs.berkeley.edu/Pubs/TechRpts/2014/EECS-2014-196.pdf>.

Saito, Y. et al., "Solid-state wetting on nanopatterned substrates", Comptes Rendus Physique, Aug.-Sep. 2013 [available online Jul. 2013], vol. 14, No. 7, pp. 619-628 <DOI:10.1016/j.crhy.2013.06.010>.

Tawfick, S. et al., "Engineering of Micro- and Nanostructured Surfaces with Anisotropic Geometries and Properties", Advanced Materials, Apr. 2012 [available online Mar. 2012], vol. 24, No. 13, pp. 1628-1674 <DOI:10.1002/adma.201103796>.

Tian, B. et al., "InP nanowire lasers epitaxially grown on (001) silicon 'V-groove' templates", International Conference on Indium Phosphide and Related Materials (Montpellier, France, May 11-15, 2014), 2014 (date added to IEEE Xplore: Aug. 2014), 2 pages <DOI:10.1109/ICIPRM.2014.6880557>.

PCT; International Search Report and Written Opinion dated Nov. 15, 2017 in the International PCT Application No. PCT/US2017/047213.

* cited by examiner

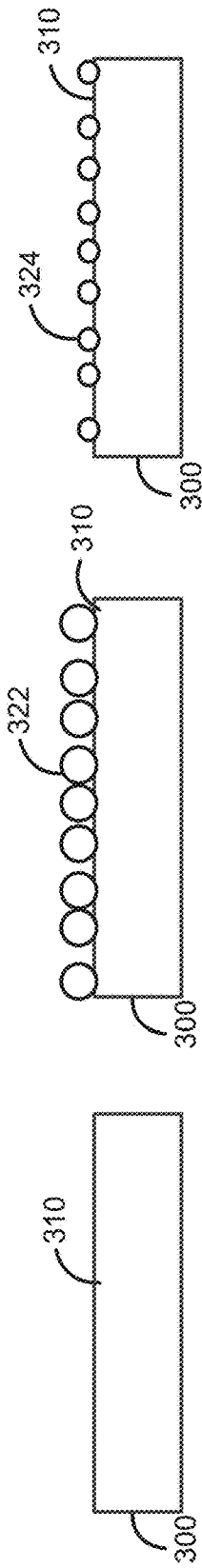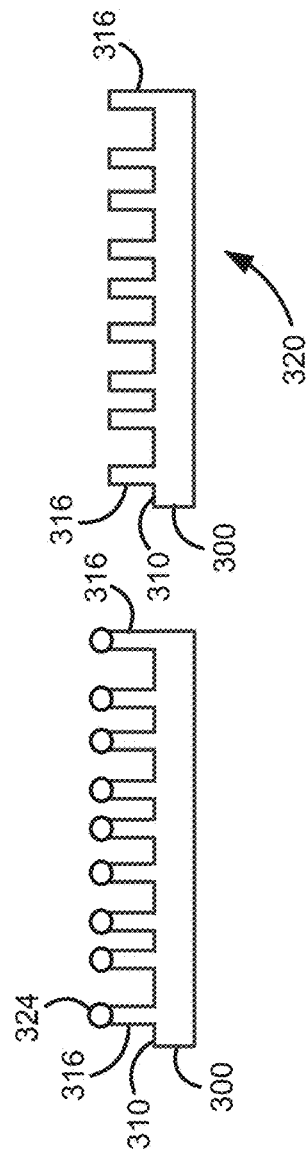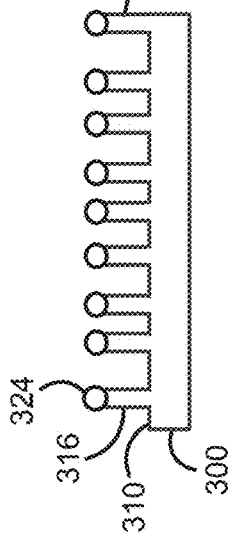
FIG. 3A  FIG. 3B  FIG. 3C  FIG. 3D  FIG. 3E

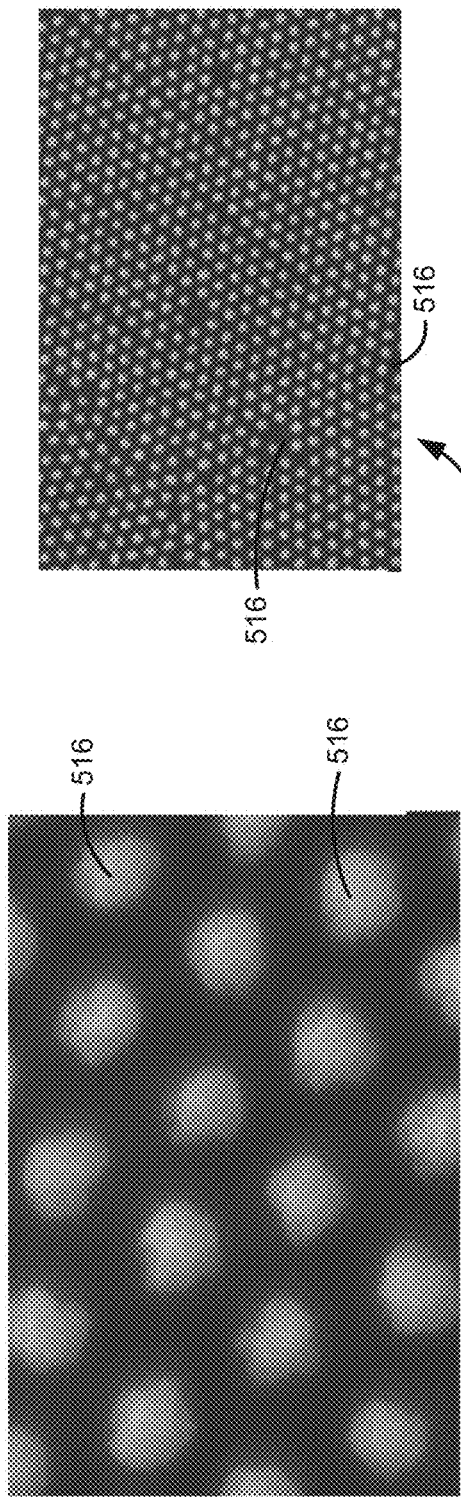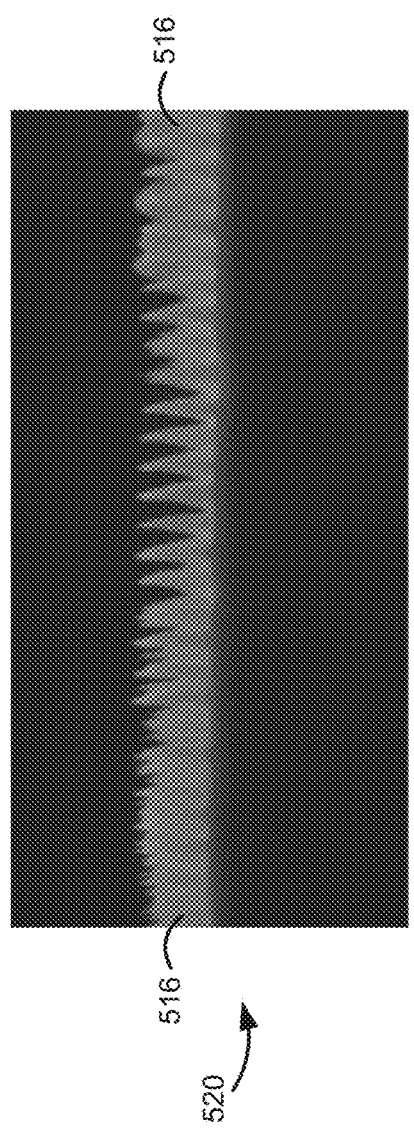

NANOSTRUCTURED SUBSTRATES FOR IMPROVED LIFT-OFF OF III-V THIN FILMS

CROSS REFERENCE TO RELATED APPLICATIONS

This application is a continuation of PCT Application No. PCT/US2017/047213 filed on Aug. 16, 2017 and entitled "NANOSTRUCTURED SUBSTRATES FOR IMPROVED LIFT-OFF OF III-V THIN FILMS." PCT Application No. PCT/US2017/047213 claims priority to and the benefit of U.S. provisional patent application No. 62/376,148 filed on Aug. 17, 2016 and entitled "NANOSTRUCTURED SUBSTRATES FOR IMPROVED LIFT-OFF OF III-V THIN FILMS." Each of the foregoing applications are incorporated by reference herein in their entireties.

FEDERALLY SPONSORED RESEARCH OR DEVELOPMENT

This invention was made with government support under DE-EE0007369 awarded by the Department of Energy. The government has certain rights in the invention.

TECHNICAL FIELD

The present disclosure relates to thin film semiconductor materials, and in particular to repeatable deposition and lift-off of III-V thin film materials for use in solar cells.

BACKGROUND

Current methods of forming GaAs thin film solar cells from GaAs or Ge substrates via epitaxial lift-off are relatively expensive, due at least in part to the cost of the substrates used and the inefficient lift-off process using etching of a sacrificial layer.

One of the current approaches for producing high-efficiency III-V solar cells on low-cost substrates involves the lattice-matched epitaxial growth on a germanium or GaAs single crystal substrate and the use of a sacrificial layer to perform epitaxial lift-off via selective etching of the sacrificial layer, followed by transfer of the device to a low-cost substrate. Unfortunately, the reuse of the very expensive substrate is problematic, due to the need for chemical etching of a sacrificial layer. An alternative approach involves the use of a low-cost substrate (e.g., crystalline Si, glass, or metal film) with a complex buffer layer to accommodate the strain caused by the lattice mismatch between the III-V film and the underlying substrate. However, both of these approaches suffer from various deficiencies, including but not limited to complexity and cost. Accordingly, improved techniques for thin film growth and lift-off are desired.

BRIEF DESCRIPTION OF THE DRAWINGS

With reference to the following description and accompanying drawings:

FIGS. 3A-3E illustrate stages of forming a nanostructured substrate in accordance with an exemplary embodiment;

FIGS. 5A-5C illustrate, respectively, a scanning electron microscope top view, a less magnified scanning electron microscope top view, and a scanning electron microscope side view of a nanostructured InP substrate having a plurality of InP nanopillars in accordance with an exemplary embodiment;

DETAILED DESCRIPTION

The following description is of various exemplary embodiments only, and is not intended to limit the scope, applicability or configuration of the present disclosure in any way. Rather, the following description is intended to provide a convenient illustration for implementing various embodiments including the best mode. As will become apparent, various changes may be made in the function and arrangement of the elements described in these embodiments without departing from principles of the present disclosure.

For the sake of brevity, conventional techniques for thin film growth, substrate preparation, materials characterization, thin film lift-off, and/or the like may not be described in detail herein. Furthermore, the connecting lines shown in various figures contained herein are intended to represent exemplary functional relationships and/or physical couplings between various elements. It should be noted that many alternative or additional functional relationships or physical connections may be present in practical systems and methods for improved lift-off of thin films and/or reuse of related substrates.

The present disclosure contemplates growth and lift-off of thin films from a nanostructured substrate, together with subsequent re-use of the nanostructured substrate to grow and lift-off additional thin films. To address drawbacks of the current approaches, disclosed herein are systems and methods that are somewhat analogous to a kerfless Si approach of epitaxial regrowth of Si on a porous Si substrate, but which utilize more controlled nanostructures. In various exemplary embodiments, the regrown thin film can be directly lifted off by attaching the thin film to a low cost substrate with epoxy and removing the film without the requirement of etching a sacrificial layer. An analogous substrate for use with epitaxial growth of III-V thin films is an etched array of ordered nanostructures on a GaAs or Ge crystalline substrate. Prior attempts have been made to produce porous III-V substrates to enable the regrowth of III-V thin films (e.g., InP and GaN) that can be subsequently lifted off; however, this prior approach typically results in uncontrolled structuring of the surface, thereby reducing the reliability of the process. Accordingly, in various exemplary embodiments, to improve epitaxial film growth and facilitate a subsequent lift-off process, aspects of nanostructured substrates, such as spacing between the nanopillars and the average nanopillar diameter, are optimized (in contrast, the porous structure formed by prior approaches utilizing electrochemical etching to enable epitaxial growth and etching-free lift-off is quite difficult to optimize).

Although III-V solar cells produced using the epitaxial lift-off process are being manufactured that have high efficiency, the cost of the epitaxial III-V semiconductor substrate and the cost of the epitaxial lift-off process using etching of a sacrificial layer remains prohibitively high.

Figure 1A:
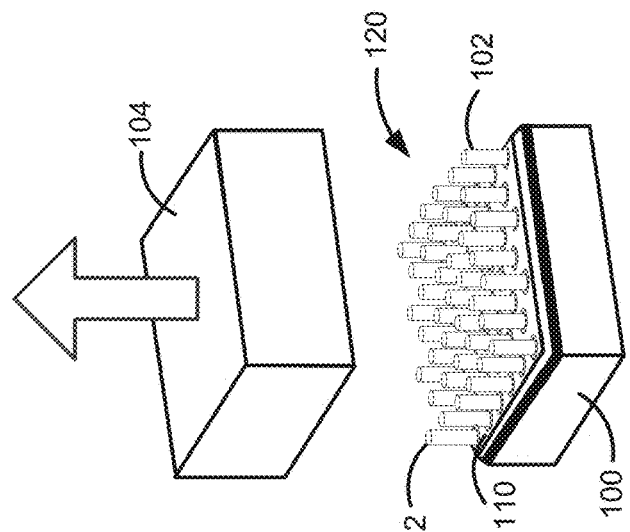
FIGS. 1A-1C illustrate epitaxial thin film growth on a nanostructured substrate in accordance with an exemplary embodiment.
Figure 1B:
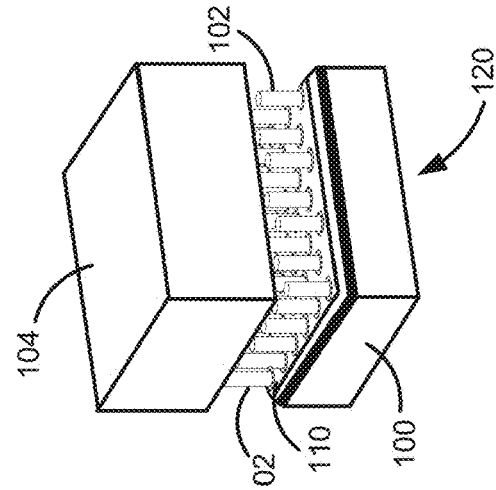
Figure 1C:
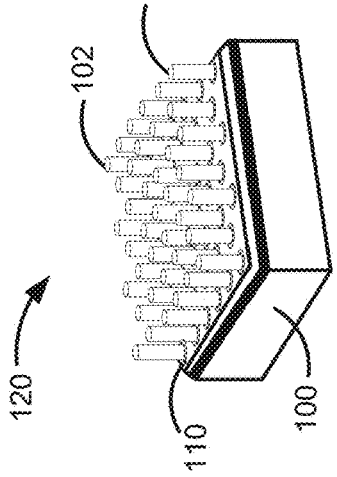

With initial reference to FIGS. 1A-1C, a nanostructured substrate 120 in accordance with various exemplary embodiments is illustrated. For example, nanostructured substrate 120 can comprise a crystalline semiconductor substrate 100 having a top surface 110 and a plurality of nanopillars 102 protruding from top surface 110.

In various embodiments, a crystalline thin film 104 is formed atop plurality of nanopillars 102. For example, crystalline thin film 104 comprises Si or InP epitaxially-grown atop nanopillars 102. In various embodiments, nanostructured substrate 120 may be optimized for the epitaxial growth of III-V solar thin films 104 while enabling a very simple lift-off (e.g., "removal") process. For example, the performance of nanostructured substrate 120 (e.g., the ease of removal of epitaxially-grown III-V solar films from the substrate) may be analogous to the lift-off of thin silicon solar cells epitaxially grown on a porous silicon substrate. Nanostructured substrate 120 may, for example, mimic properties and/or performance of a porous III-V substrate, thereby enabling epitaxial overgrowth onto such a nanostructured substrate based on nanopillars 102. Further, reusable nanostructured substrates in accordance with the present disclosure may substantially reduce the cost of the substrate and the lift-off process.

Currently, although multijunction III-V semiconductor photovoltaic devices have been demonstrated to have very high conversion efficiency, the associated costs of such devices have limited their applicability to satellites and concentrating photovoltaic systems. The main issue is that these high-efficiency photovoltaic devices must be epitaxially grown (using relatively expensive deposition techniques) onto expensive crystalline Ge or GaAs substrates, due to lattice matching constraints, to achieve the high-quality crystalline material required for high-efficiency photovoltaic devices.

With reference back to FIGS. 1A-1C, an analogous substrate for the III-V thin film case is an array of nanopillars 102 grown on a silicon substrate 100. The crystalline silicon substrate 100 enables vertical growth of III-V nanopillars 102 from the top surface 110. Note that while attempts have been made to produce porous III-V substrates to enable the regrowth of III-V thin films that can be subsequently lifted off, this approach requires the use of an expensive III-V substrate. In various embodiments, the spacing between nanopillars 102 and the diameter of nanopillars 102 can be varied to optimize the subsequent epitaxial growth, in contrast to a porous structure formed by etching, which is quite difficult to optimize. Accordingly, exemplary embodiments reduce or eliminate the need for a complex buffer layer to accommodate for strain due to lattice mismatch, as is required for traditional epitaxial growth of III-V semiconductor thin films onto crystalline Si substrates, because the strain relief occurs within (and/or as a result of the presence of) nanopillars 102.

To address the foregoing problems with existing approaches, in various exemplary embodiments an approach is utilized that is analogous to a technique used for Si solar cells: epitaxial growth of a Si solar cell and/or thin film onto a porous silicon layer on a crystalline Si substrate, followed by etching-free lift-off of the Si solar cell.

In various exemplary embodiments, nanopillars 102 (for example, III-V nanopillars such as InGaAsP) may be formed on a top surface 110 of crystalline semiconductor substrate 100 (for example, Si) in order to facilitate subsequent growth of high-quality thin films on nanopillars 102. For example, InP nanopillars 102 may be grown on an InP(100) substrate 100. In various exemplary embodiments, nanopillars 102 may have an average diameter of between about 50 nm and about 900 nm. Nanopillars 102 may, for example, have an average height of between about 100 nm and about 900 nm. Nanopillars 102 may, for example, be spaced apart from one another in various patterns (for example, grids, offset grids, geometric patterns, and/or the like), with an average spacing between adjacent and/or nearby nanopillars of between about 10 nm and about 500 nm. In various embodiments, substrate 100 comprises nanopillars 102 that are substantially similar to one another. In other exemplary embodiments, substrate 100 can comprise nanopillars 102 that differ substantially from one another in terms of diameter, height, and/or spacing (for example, via a gradient, a repeating pattern, and/or the like). Further, the plurality of nanopillars 102 may comprise the same material, or individual nanopillars 102 may comprise different materials from one another.

In various exemplary embodiments, nanopillars 102 may comprise alloys with lattice constants ranging from about 5.6533 angstroms (i.e., that of GaAs) to about 6.0584 angstroms (i.e., that of InAs), which includes the lattice constant of InP of 5.8688 angstroms. However, any suitable alloys may be utilized to form nanopillars 102. Further, nanopillars 102 may comprise the same material as crystalline semiconductor substrate 100, or may comprise different materials from substrate 100.

It will be appreciated that the nanostructured substrates (e.g., nanostructured substrates 120) disclosed herein may be considered a "virtual single crystal" for use in connection with epitaxial growth of high-quality III-V thin films (e.g., thin film 104), for example for use in solar cells, on low-cost substrates. Via use of a desirable configuration of nanopillars 102, a higher-quality thin film 104 may be grown thereon, for example due to reduced lattice mismatch, improved strain relief, and/or the like.

With initial reference to FIGS. 2A-2D, various stages of forming a nanostructured substrate 220 in accordance with various embodiments are illustrated. For example, nanostructured substrate 220 may be formed via low-cost nanolithography (e.g., nanosphere lithography) to etch nanostructures into surface 210 of a single crystal semiconductor substrate (such as InP, Si, III-V or Ge) 200 to enable epitaxial growth and facile lift-off of III-V thin films. In various embodiments, crystalline substrate 200 is lattice-matched to a desired III-V thin film, and optimization of the surface morphology of nanostructured substrate 220 permits facile lift-off of the III-V thin film from and reuse of nanostructured substrate 220.

With reference now to FIGS. 3A-3E, various stages of forming a nanostructured substrate 320 in accordance with various embodiments are illustrated. Similar to FIGS. 2A-2D, a nanostructured substrate 320 may be formed via low-cost nanolithography (e.g., nanosphere lithography) to etch nanostructures into surface 310 of a single crystal semiconductor substrate (such as InP, Si, III-V or Ge) 300 to enable epitaxial growth and facile lift-off of III-V thin films. In various embodiments, crystalline substrate 300 is lattice-matched to a desired III-V thin film, and optimization of the surface morphology of nanostructured substrate 320 permits facile lift-off of the III-V thin film from and reuse of nanostructured substrate 320.

With reference back to FIG. 2A and FIG. 3B, in various embodiments, a plurality of nanospheres 222 and/or 322 is applied to surface 210 and/or 310 of crystalline semiconductor substrate 200 and/or 300. For example, nanospheres 222 and/or 322 can comprise polystyrene and/or silicon dioxide. In various embodiments, nanospheres 222 and/or 322 can comprise one or more of polystyrene and silicon dioxide. For example, a single layer ("mono layer") of nanospheres 222 and/or 322 can be applied to surface 210 and/or 310 in a predetermined pattern. In various embodiments, nanospheres 222 and/or 322 can, for example, be individually applied to surface 210 and/or 310. In other embodiments, a plurality of nanospheres 222 and/or 322 are applied to surface 210 and/or 310 simultaneously such as by, for example, a pre-assembled template. Any manner of applying any suitable pattern of nanospheres 222 and/or 322 to surface 210 and/or 310 is within the scope of the present disclosure.

In various embodiments, after nanospheres 222 and/or 322 are applied to surface 210 and/or 310 of substrate 200 and/or 300, one or more dimensions of nanospheres 222 and/or 322 can be adjusted to one or more desired parameters. For example, with reference to FIG. 2B and FIG. 3C, adjusted nanospheres 224 and/or 324 can comprise a smaller dimension, such as, for example, a smaller diameter, than nanospheres 222 and/or 322 of FIG. 2B or 3B. In various embodiments, adjusted nanospheres 224 and/or 324 are formed by plasma etching of nanospheres 222 and/or 322 until the desired dimension, size, and/or shape is achieved.

Figure 2A:
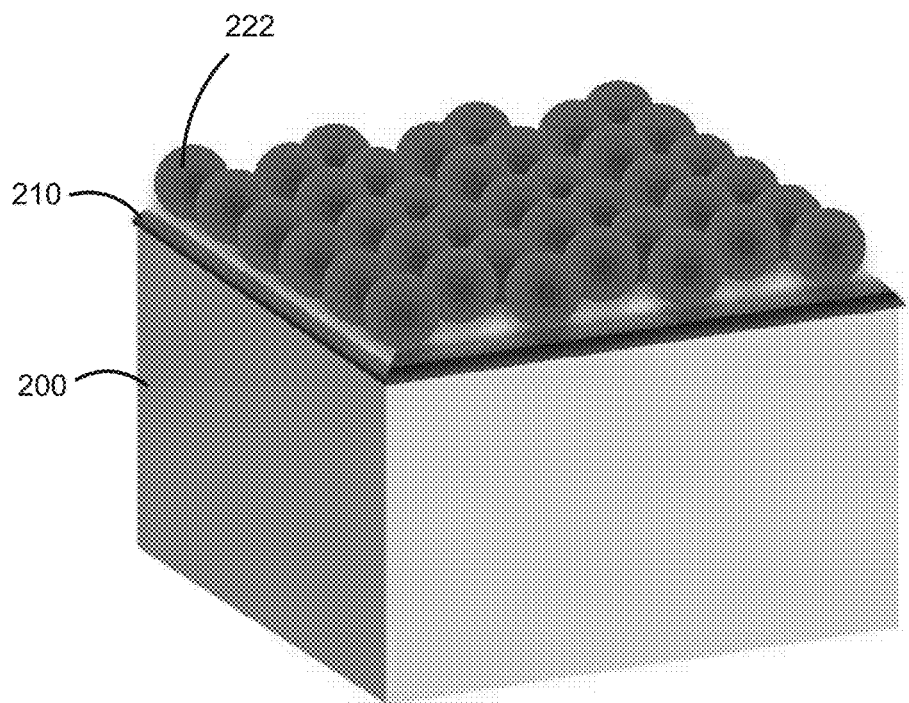
FIGS. 2A-2D illustrate stages of forming a nanostructured substrate in accordance with an exemplary embodiment.
Figure 2B:
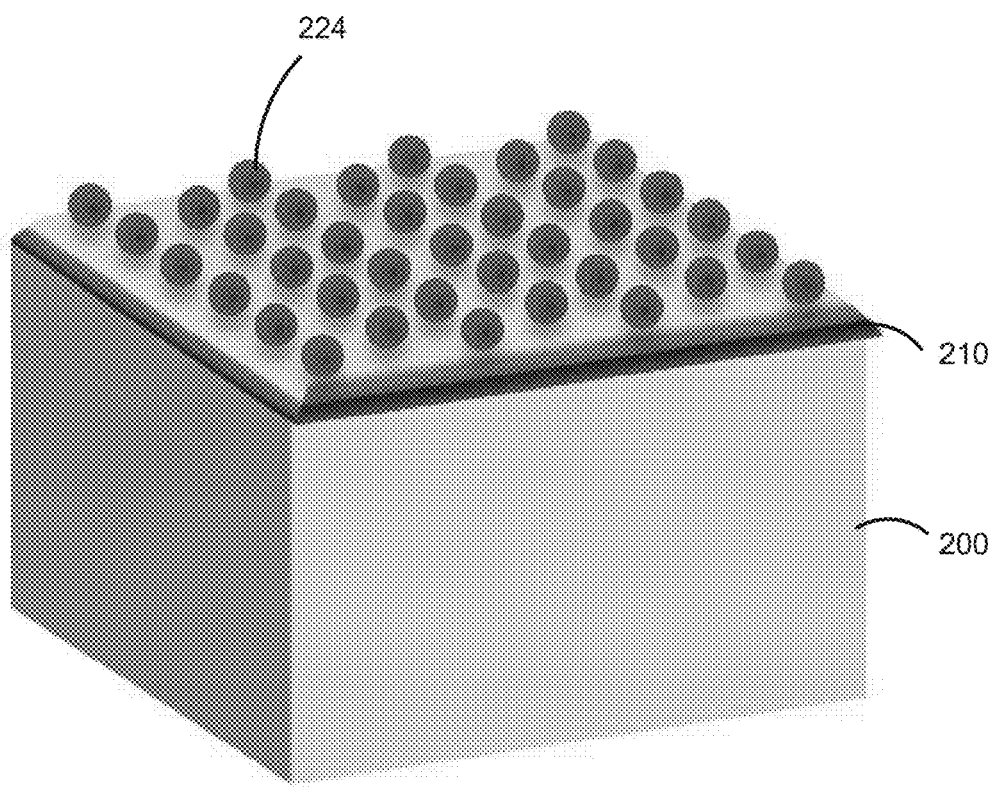
Figure 2C:
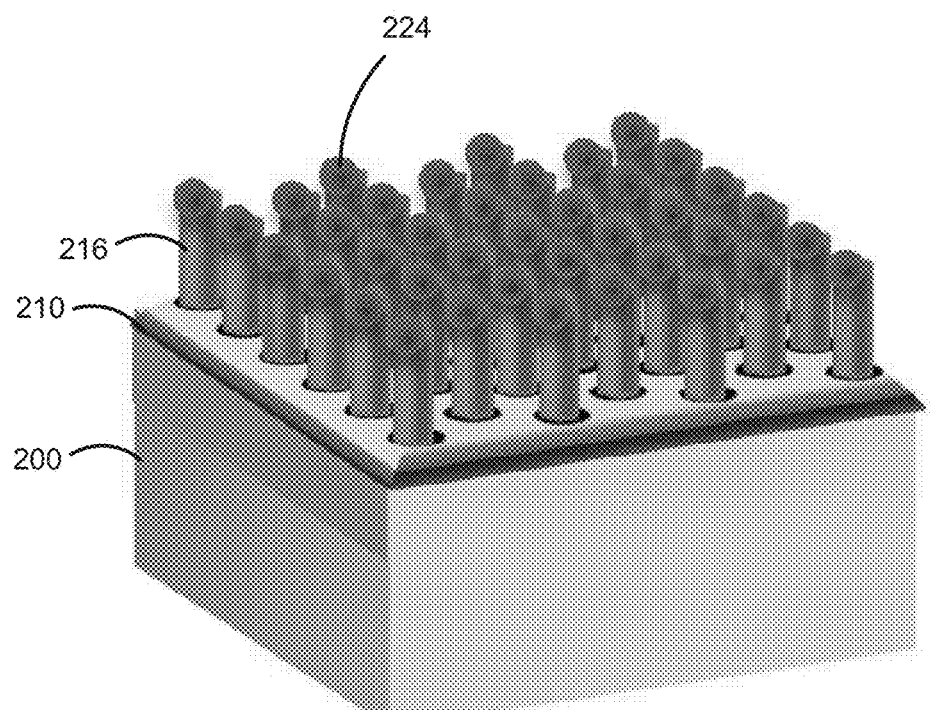

With reference to FIG. 2C and FIG. 3D, after application of a suitable etchant to substrate 200 and/or 300, a plurality of nanopillars 216 and/or 316 are formed. Suitable etchants can comprise, for example, one or more of Ar, $BCl_3$, $Cl_2$, $O_2$, $CH_4$, and $H_2$. In various embodiments, substrate 200 and/or 300 is etched with an etchant that does not dissolve adjusted nanospheres 224 and/or 324, thereby only dissolving substrate 200 and/or 300 and forming nanopillars 216 and/or 316.

Figure 2D:
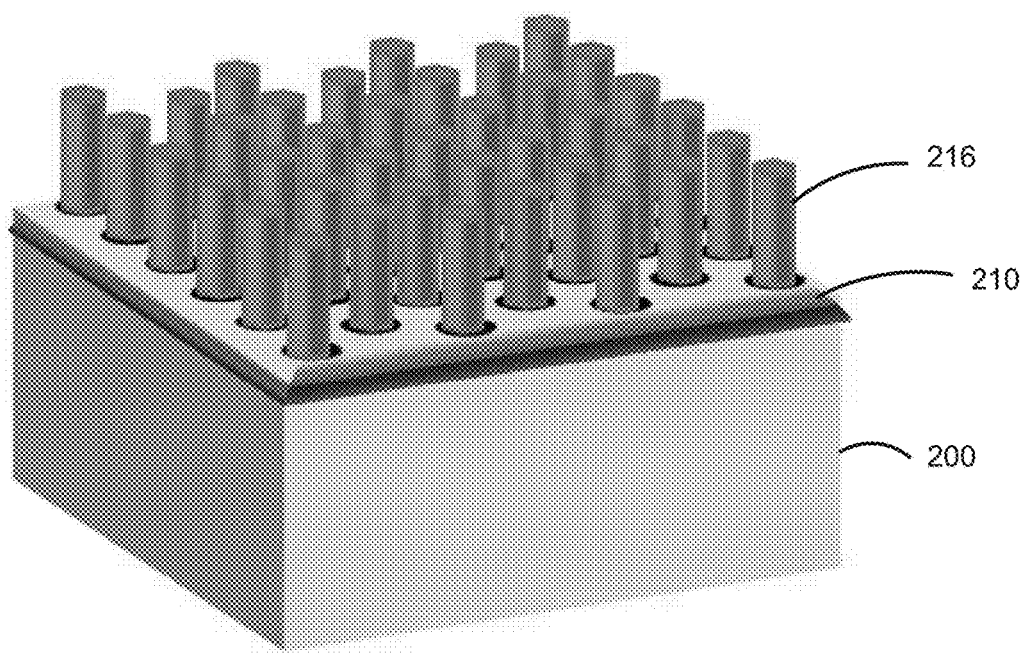
Figure 4A:
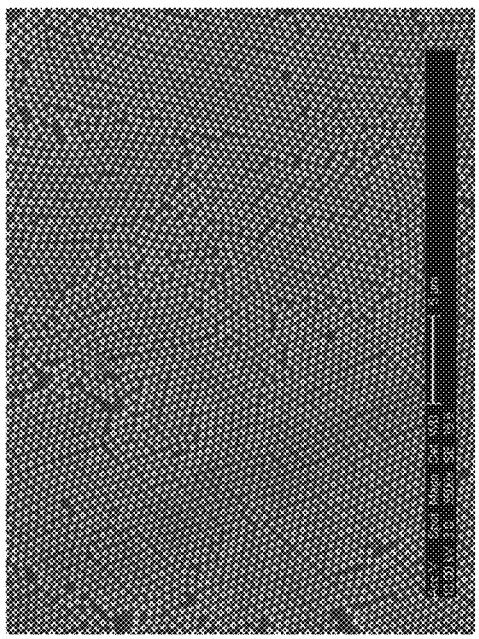
FIGS. 4A-4D illustrate, respectively, a scanning electron microscope top view, a less magnified scanning electron microscope top view, a scanning electron microscope side view, and a more magnified scanning electron microscope side view of an InP substrate having a plurality of InP nanopillars in accordance with an exemplary embodiment.
Figure 4B:
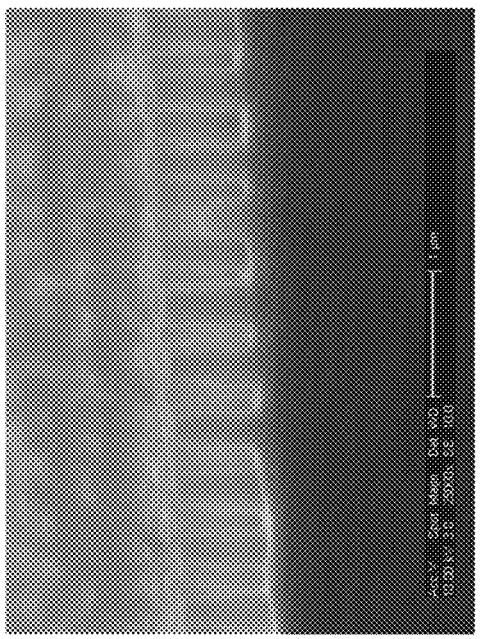
Figure 4C:
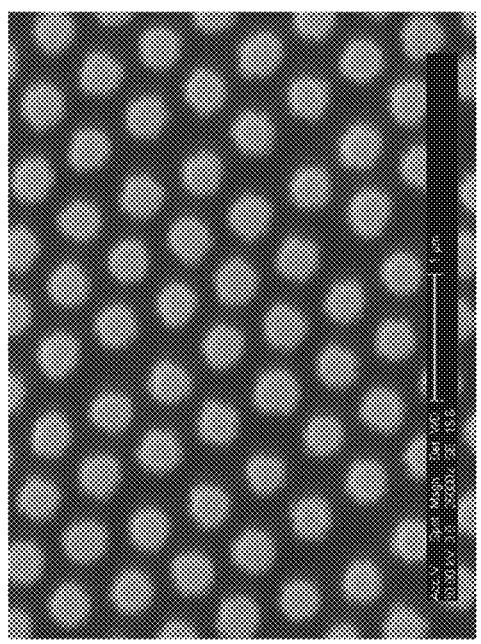
Figure 4D:
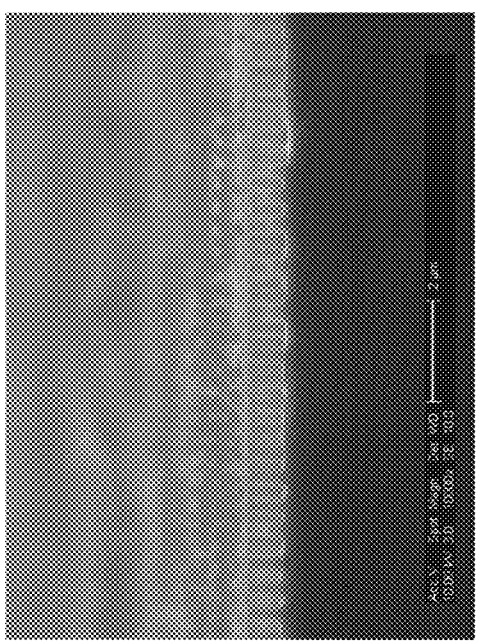

In various embodiments, with reference to FIG. 2D and FIG. 3E, after nanopillars 216 and/or 316 are formed, adjusted nanospheres 224 and/or 324 can be removed, leaving behind a nanostructured substrate 220 and/or 320. In various embodiments, adjusted nanospheres 224 and/or 324 are removed via a physical removal, such as removal of the template. In other embodiments, adjusted nanospheres 224 and/or 324 are removed via a chemical removal, such as a second etchant. In such embodiments, the second etchant does not substantially dissolve nanostructured substrate 220 and/or 320, leaving nanopillars 216 and/or 316 substantially intact.

With reference now to FIGS. 4A-4D, a nanostructured substrate 420 in accordance with various embodiments is illustrated in microscopic detail. For example, nanostructured substrate 420 can comprise an InP substrate having a plurality of InP nanopillars. In various embodiments, nanostructured substrate 420 can be formed utilizing nanospheres having a diameter of approximately 0.5 microns, etched for approximately 10 minutes.

With reference now to FIGS. 5A-5C, a nanostructured substrate 520 in accordance with various embodiments is illustrated in microscopic detail. Nanostructured substrate 520 comprises an InP crystalline substrate and a plurality of InP nanopillars 516. For example, nanostructured substrate 520 can comprise an InP substrate having a plurality of InP nanopillars. In various embodiments, nanostructured substrate 520 can be formed utilizing nanospheres having a diameter of approximately 0.5 microns, etched for approximately 15 minutes.

Figure 6A:
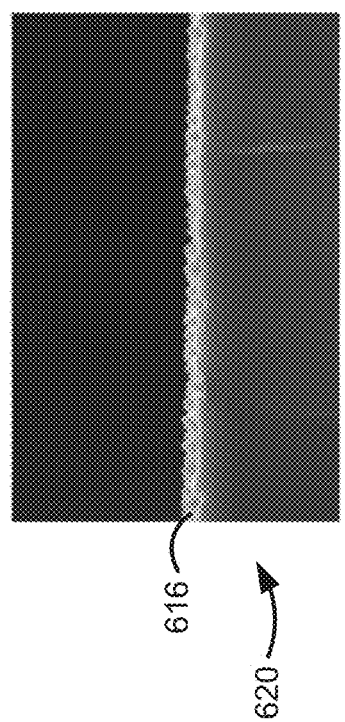
FIGS. 6A-6C illustrate, respectively, a scanning electron microscope side view, a scanning electron microscope top view, and a less magnified scanning electron microscope top view of a Si substrate having a plurality of Si nanopillars in accordance with an exemplary embodiment.
Figure 6C:
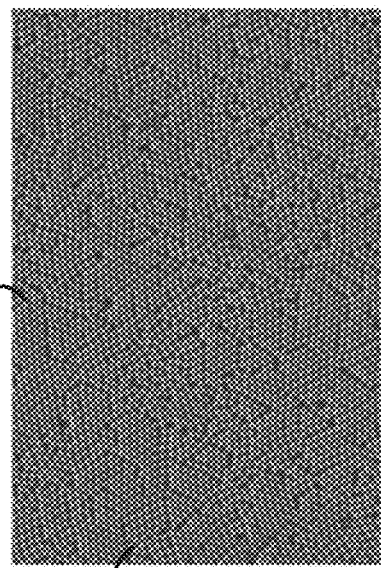
Figure 6B:
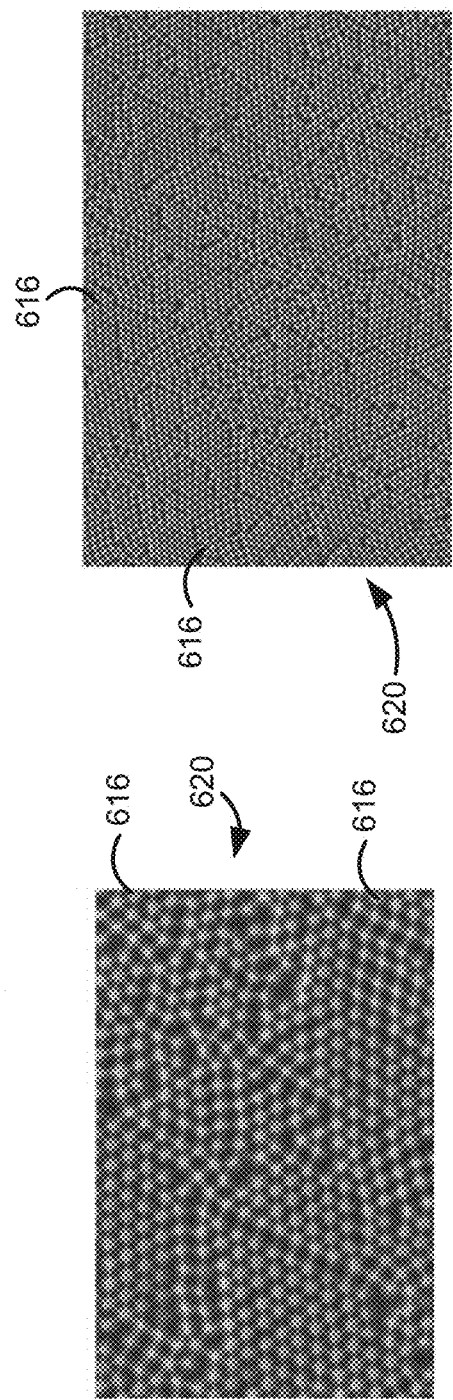

With reference to FIGS. 6A-6C, a nanostructured substrate 620 in accordance with various embodiments is illustrated in microscopic detail. Nanostructured substrate 620 comprises a Si(100) crystalline substrate and a plurality of Si nanopillars 616. For example, Si nanopillars 616 of nanostructured substrate 620 can be formed utilizing nanospheres having a diameter of approximately 1 micron and etching for approximately 2 minutes.

Figure 7:
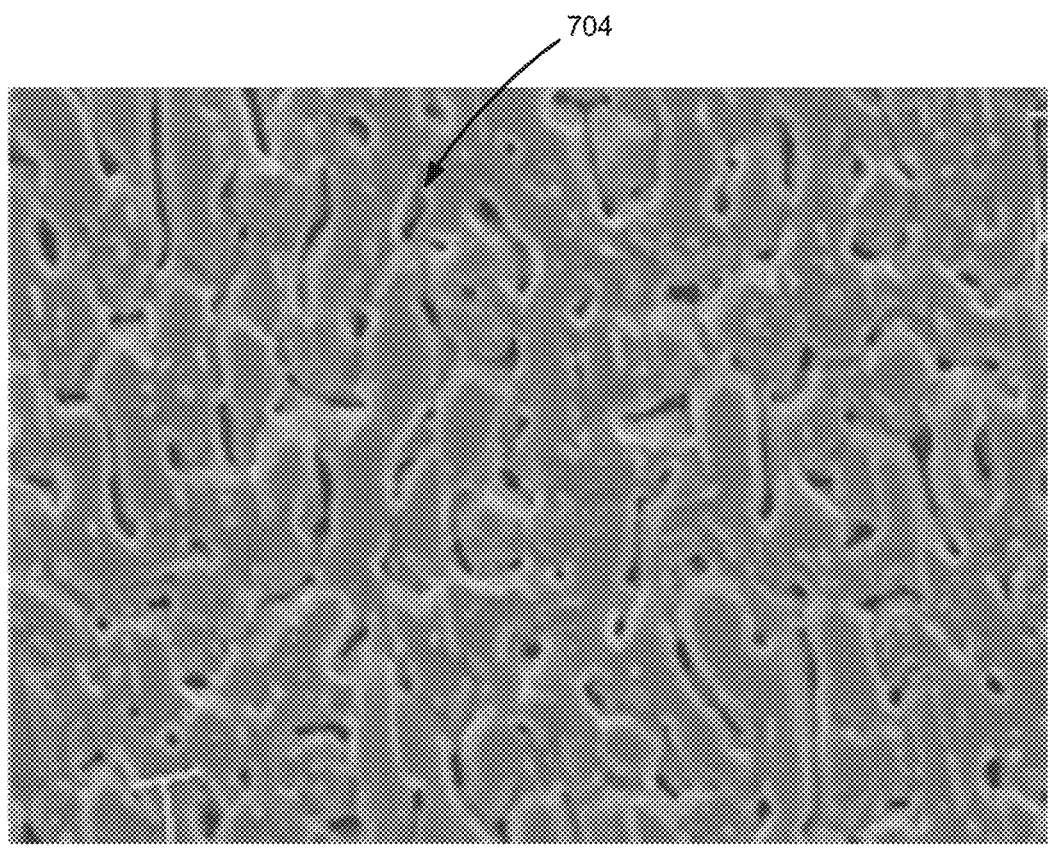
FIG. 7 illustrates a scanning electron microscope top view of an InP film grown on an InP substrate having a plurality of InP nanopillars in accordance with an exemplary embodiment.

With reference to FIG. 7, a semiconductor thin film 704 in accordance with various embodiments is illustrated. Thin film 704 comprises InP, and was grown on an InP nanostructured substrate (such as, for example, nanostructured substrate 420 of FIGS. 4A-4C). For example, thin film 704 can comprise a film that is approximately 40 microns thick, having a stoichiometric crystal structure with grains of approximately 7 microns by 20 microns. Thin film 704 may be formed by heating a precursor material (such as indium) at a temperature of approximately 908° C., and a precursor material (such as phosphorous) at an initial temperature of approximately 450° C., and the substrate at a temperature of approximately 680° C.

Figure 8A:
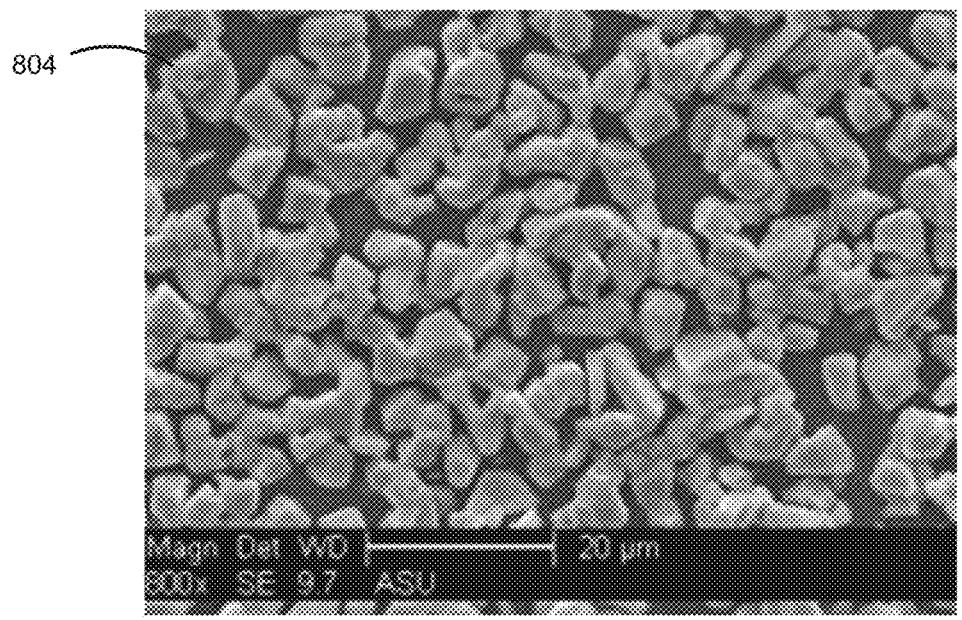
FIGS. 8A and 8B illustrate, respectively, a scanning electron microscope top view, and a scanning electron microscope side view of an InP film grown on a Si substrate in accordance with an exemplary embodiment.
Figure 8B:
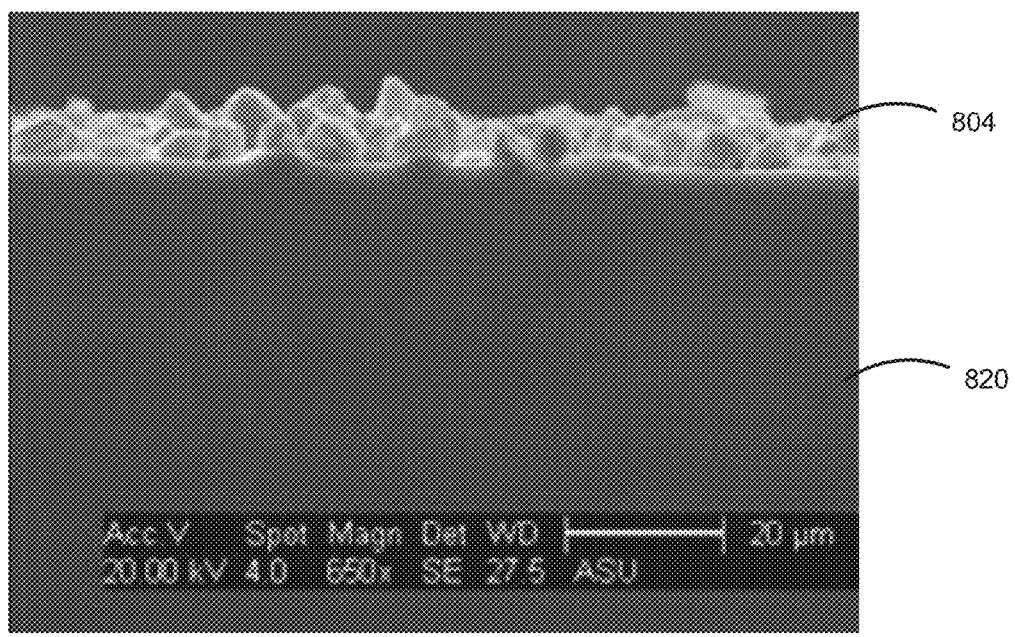

With reference to FIGS. 8A and 8B, a thin film 804 in accordance with various embodiments is illustrated. For example, thin film 804 can comprise an InP film grown on a structured substrate 820. In various embodiments, structured substrate 820 can comprise a Si substrate having very short (e.g., having a height less than 20 microns) Si structures. For example, structured substrate 820 can be essentially flat. In various embodiments, thin film 804 may be configured with an "island growth" pattern of growth and/or development.

Figure 9A:
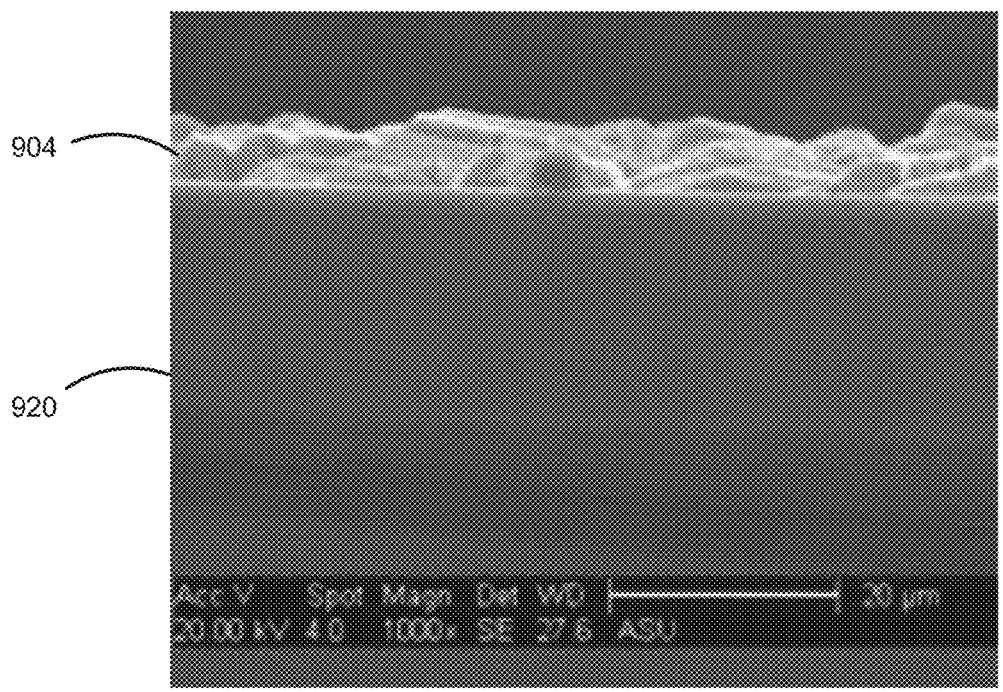
FIGS. 9A and 9B illustrate, respectively, a scanning electron microscope side view and a scanning electron microscope top view of an InP film grown on a nanostructured Si substrate in accordance with an exemplary embodiment.
Figure 9B:
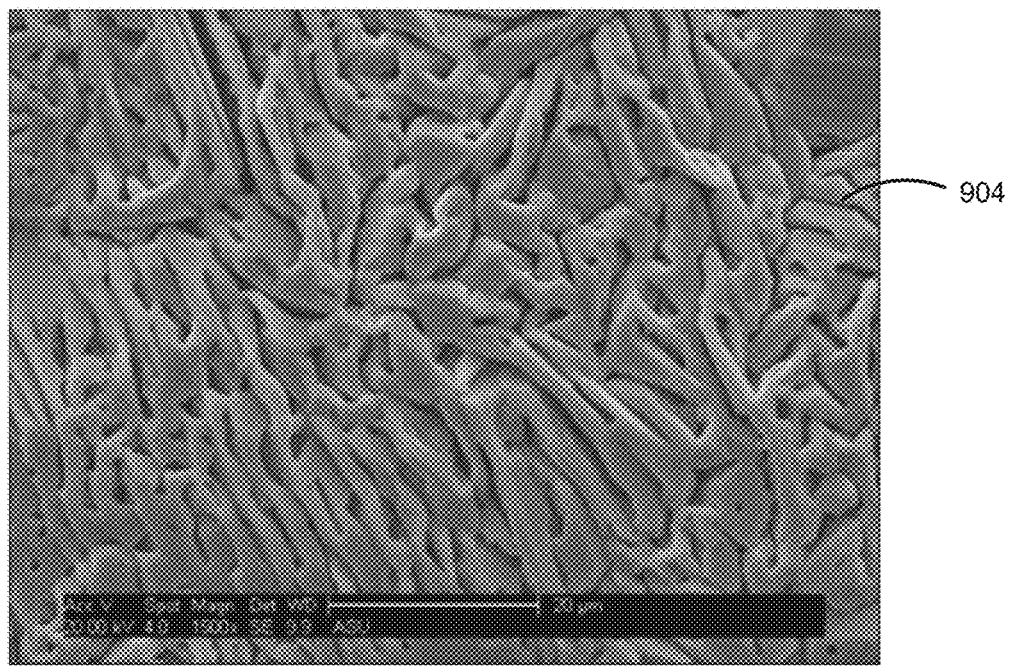
Figure 9C:
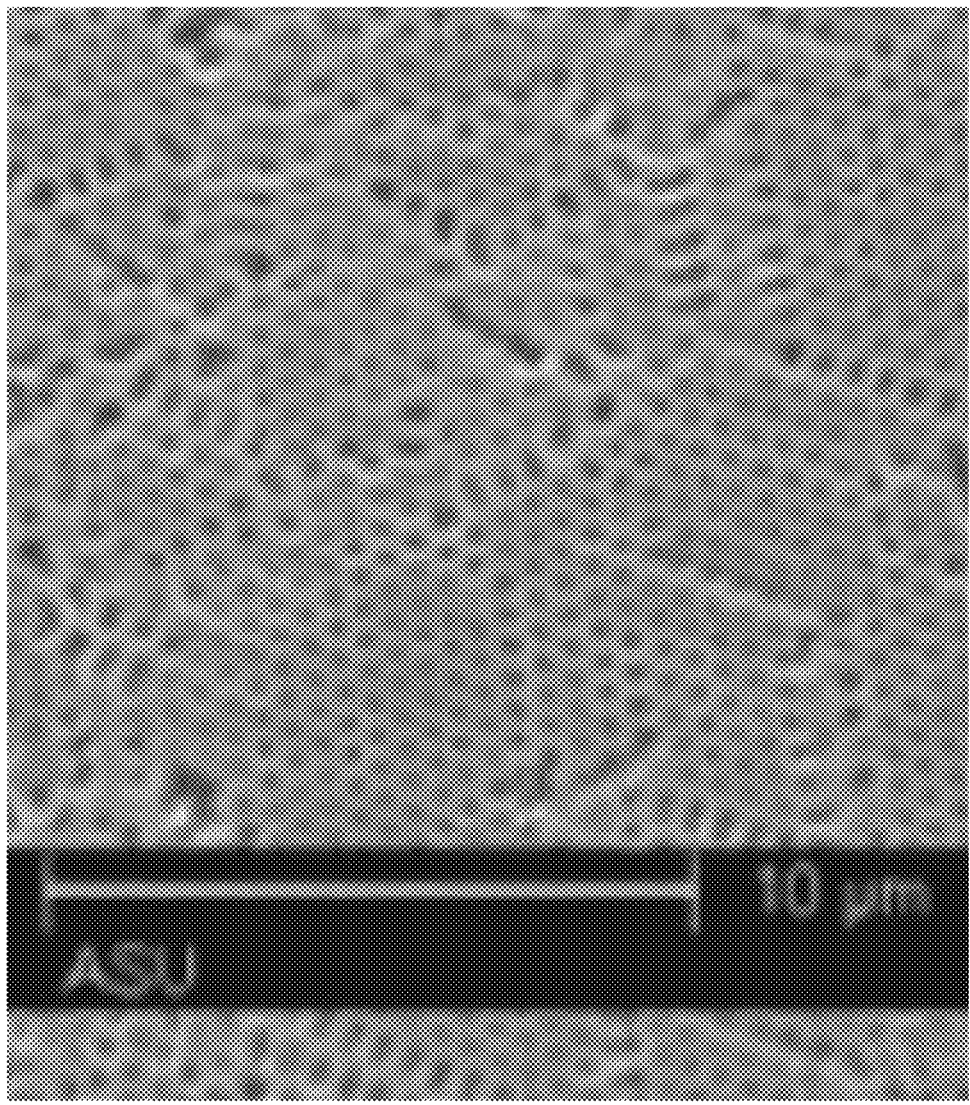
FIG. 9C illustrates a nanostructured Si substrate in accordance with an exemplary embodiment.

With reference to FIGS. 9A and 9B, a thin film 904 in accordance with various embodiments is illustrated. For example, thin film 904 can comprise an InP film grown on a structured substrate 920. With reference to FIG. 9C, structured substrate 920 can comprise a Si substrate having very short (e.g., having a pitch of less than 0.5 microns) Si structures. For example, structured substrate 920 can be essentially flat. In various embodiments, thin film 904 may be configured with a "coalesced growth" pattern of growth and/or development.

Figure 10A:
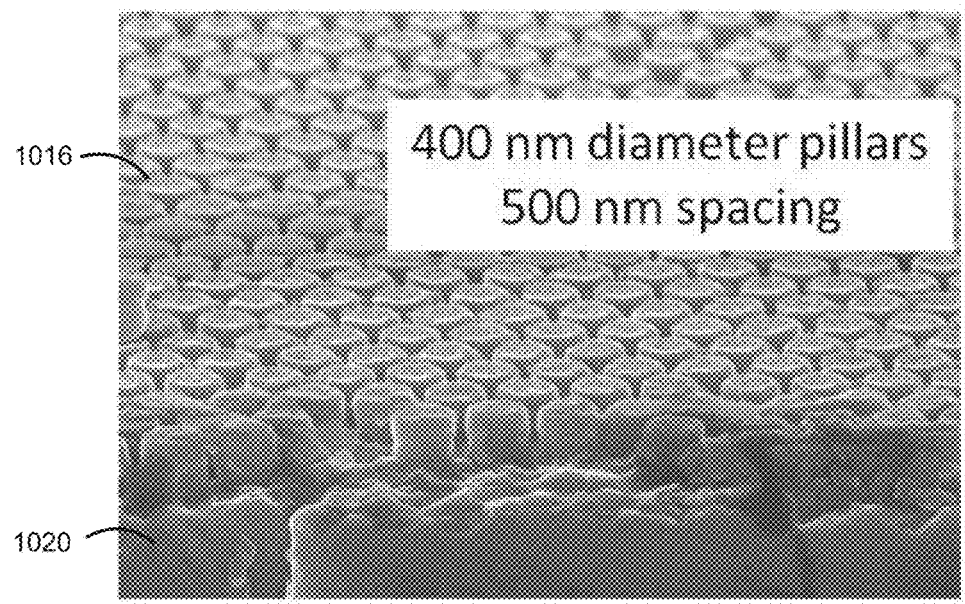
FIGS. 10A and 10B illustrate, respectively, a scanning electron microscope perspective view and a more magnified scanning electron microscope perspective view of a substrate having a plurality of InP nanopillars in accordance with an exemplary embodiment.
Figure 10B:
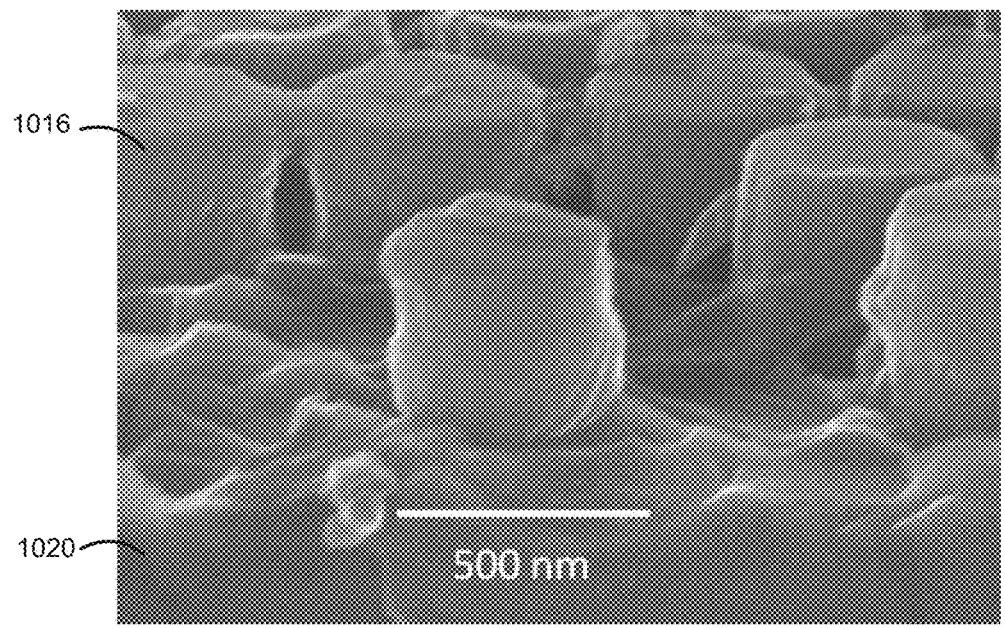

With reference to FIGS. 10A and 10B, a nanostructured substrate 1020 is illustrated. In various embodiments, nanostructured substrate 1020 comprises an InP substrate having a plurality of InP nanopillars 1016. For example, nanopillars 1016 can comprise InP nanopillars having an average diameter of approximately 400 nanometers and spaced approximately 500 nanometers apart, on average.

Figure 11A:
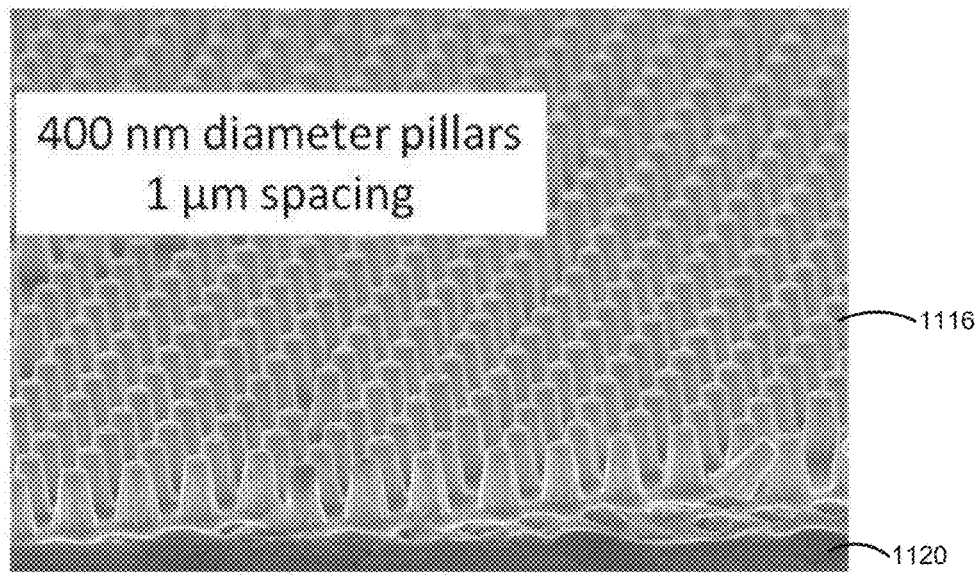
FIGS. 11A and 11B illustrate, respectively, a scanning electron microscope perspective view and a more magnified scanning electron microscope perspective view of a substrate having a plurality of InP nanopillars in accordance with an exemplary embodiment.
Figure 11B:
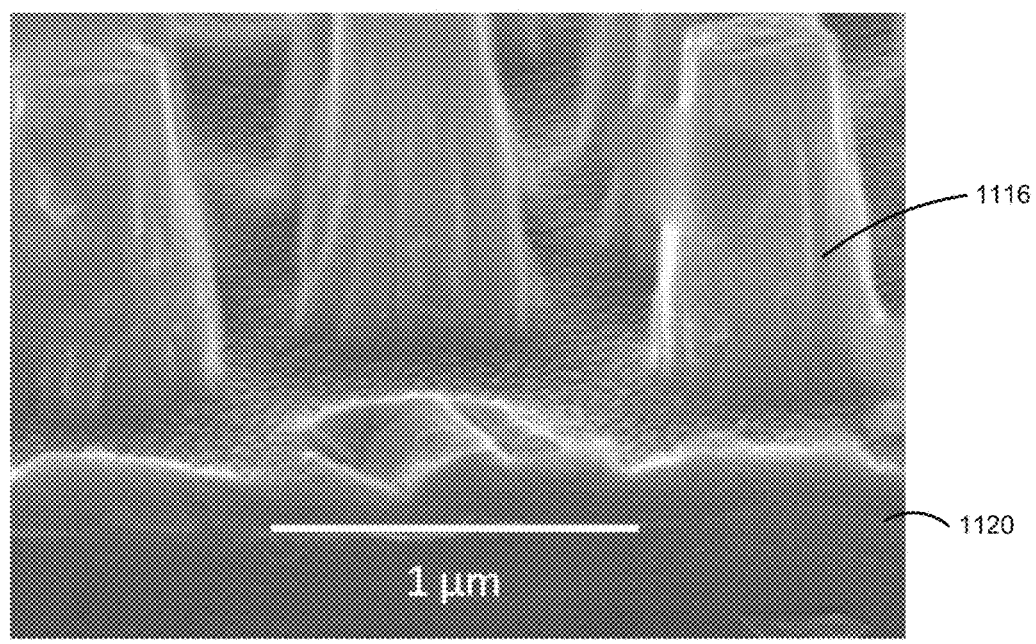

With reference to FIGS. 11A and 11B, a nanostructured substrate 1120 is illustrated. In various embodiments, nanostructured substrate 1120 comprises an InP substrate having a plurality of InP nanopillars 1116. For example, nanopillars 1116 can comprise InP nanopillars having an average diameter of approximately 400 nanometers and spaced approximately 1 micrometer apart, on average.

Figure 12A:
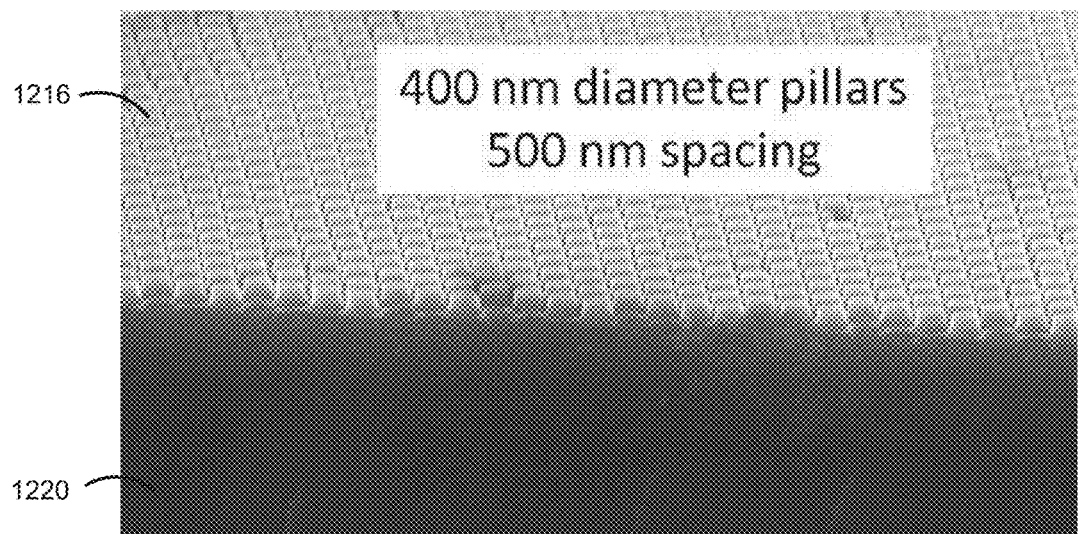
FIGS. 12A and 12B illustrate, respectively, a scanning electron microscope perspective view and a more magnified scanning electron microscope perspective view of a Si(111) substrate having a plurality of Si nanopillars in accordance with an exemplary embodiment.
Figure 12B:
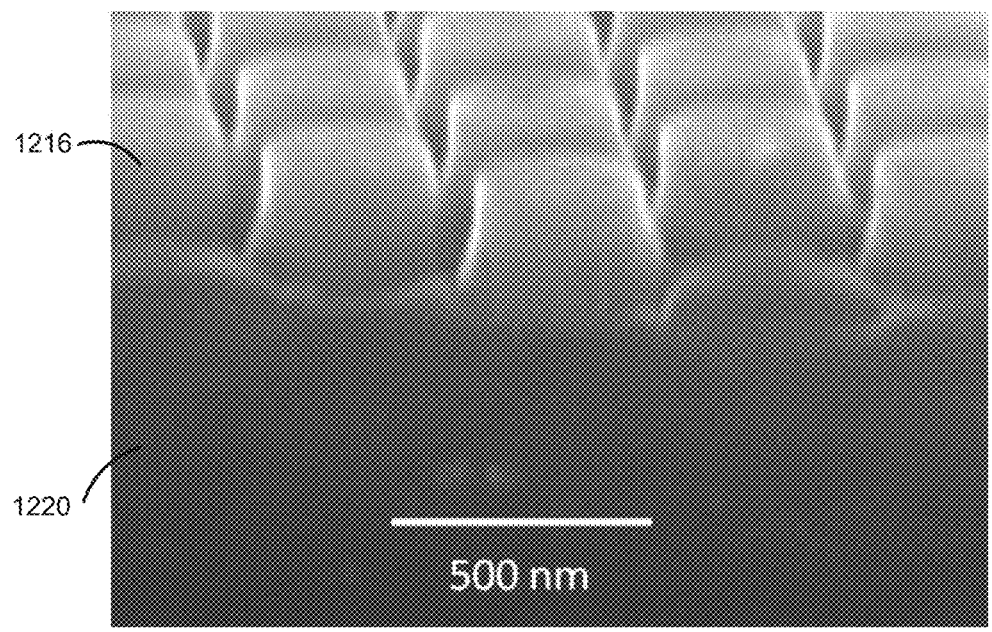

With reference to FIGS. 12A and 12B, a nanostructured substrate 1220 is illustrated. In various embodiments, nanostructured substrate 1220 comprises a Si substrate having a plurality of Si(111) nanopillars 1216. For example, nanopillars 1216 can comprise Si(111) nanopillars having an average diameter of approximately 400 nanometers and spaced approximately 500 nanometers apart, on average.

Figure 13A:
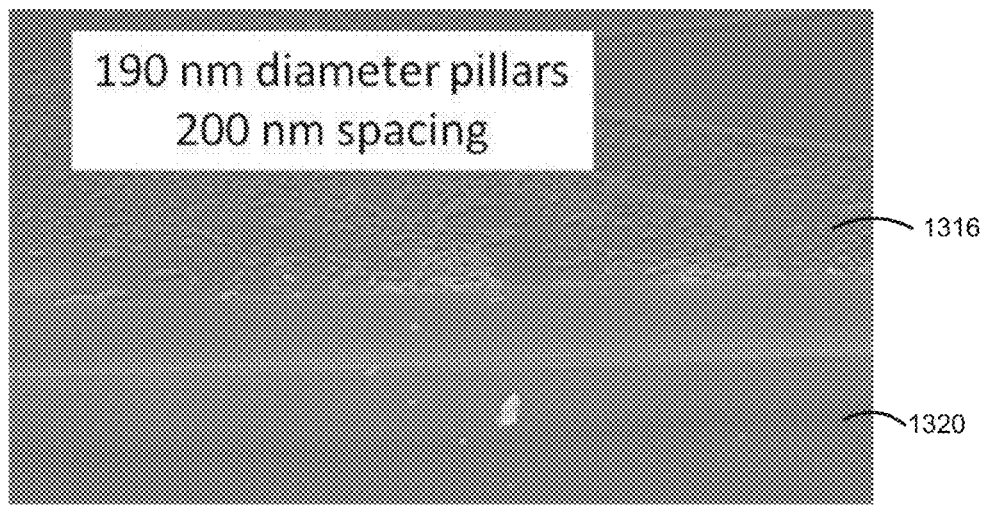
FIGS. 13A and 13B illustrate, respectively, a scanning electron microscope perspective view and a more magnified scanning electron microscope perspective view of a Si(111) substrate having a plurality of Si nanopillars in accordance with an exemplary embodiment.
Figure 13B:
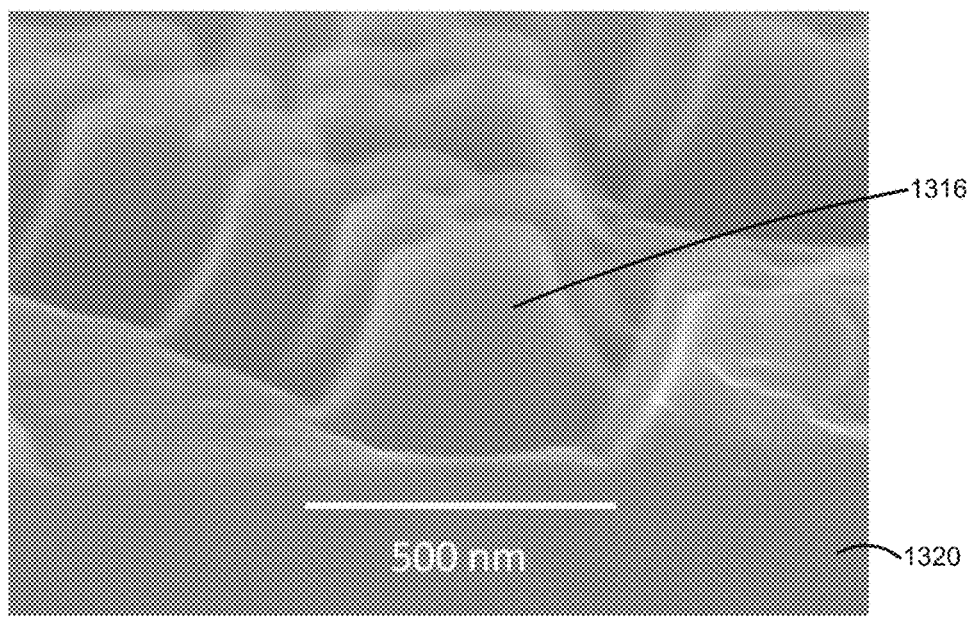

With reference to FIGS. 13A and 13B, a nanostructured substrate 1320 is illustrated. In various embodiments, nanostructured substrate 1320 comprises a Si substrate having a plurality of Si(111) nanopillars 1316. For example, nanopillars 1316 can comprise Si(111) nanopillars having an average diameter of approximately 190 nanometers and spaced approximately 200 nanometers apart, on average.

Figure 14A:
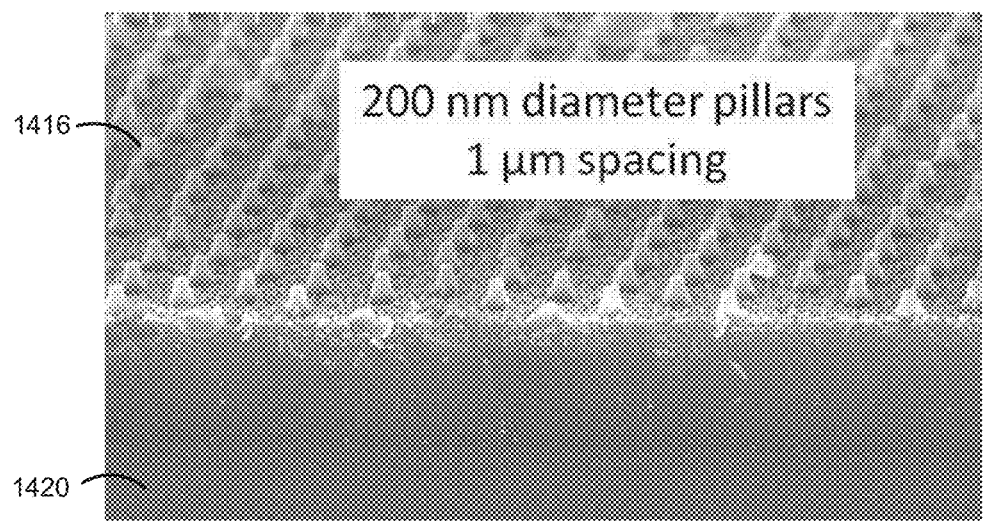
FIGS. 14A and 14B illustrate, respectively, a scanning electron microscope perspective view and a more magnified scanning electron microscope perspective view of a Si(100) substrate having a plurality of Si nanopillars in accordance with an exemplary embodiment.
Figure 14B:
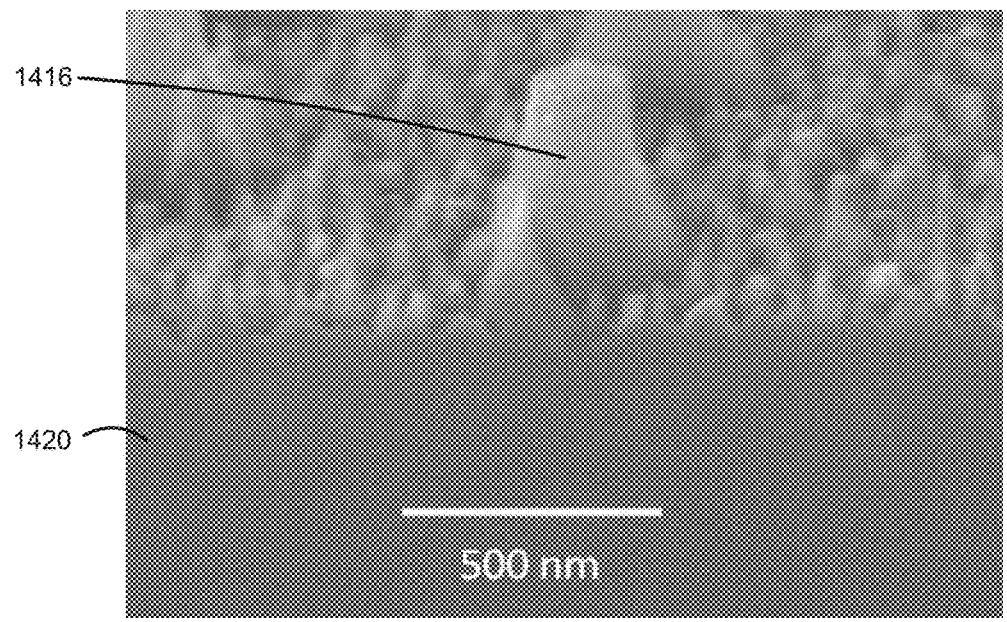

With reference to FIGS. 14A and 14B, a nanostructured substrate 1420 is illustrated. In various embodiments, nanostructured substrate 1420 comprises a Si substrate having a plurality of Si(100) nanopillars 1416. For example, nanopillars 1416 can comprise Si(100) nanopillars having an average diameter of approximately 200 nanometers and spaced approximately 1 micrometer apart, on average.

Figure 15A:
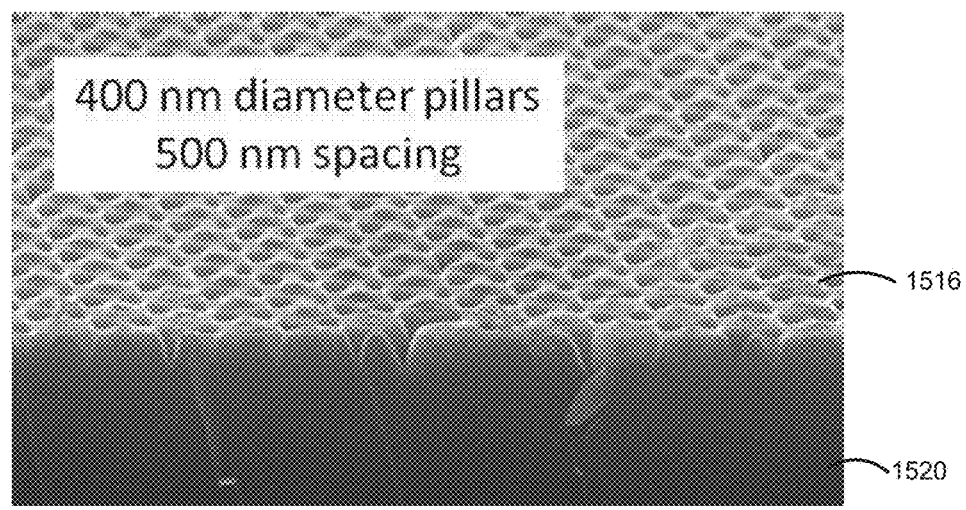
FIGS. 15A and 15B illustrate, respectively, a scanning electron microscope perspective view and a more magnified scanning electron microscope perspective view of a Si(100) substrate having a plurality of Si nanopillars in accordance with an exemplary embodiment.
Figure 15B:
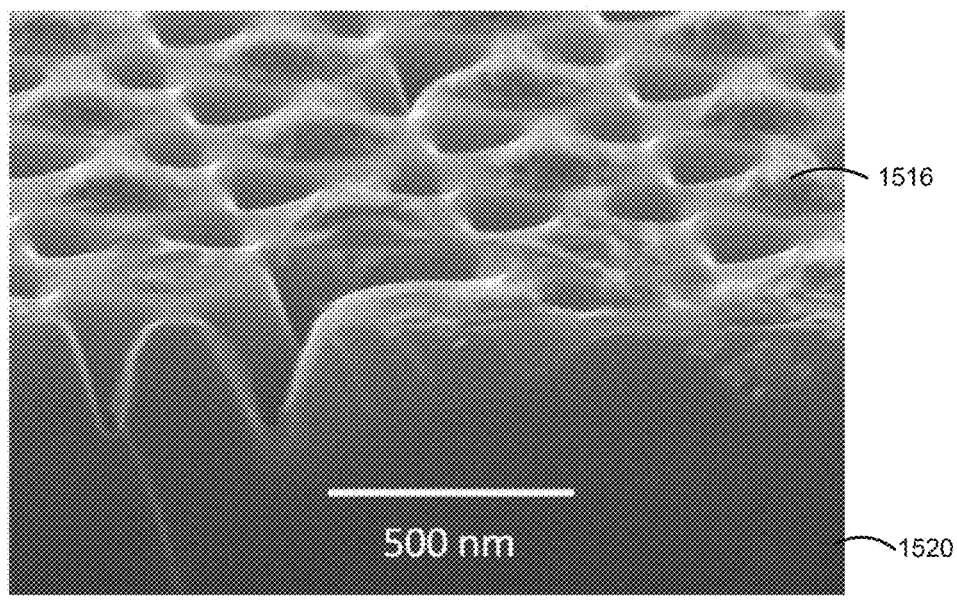
Figure 16A:
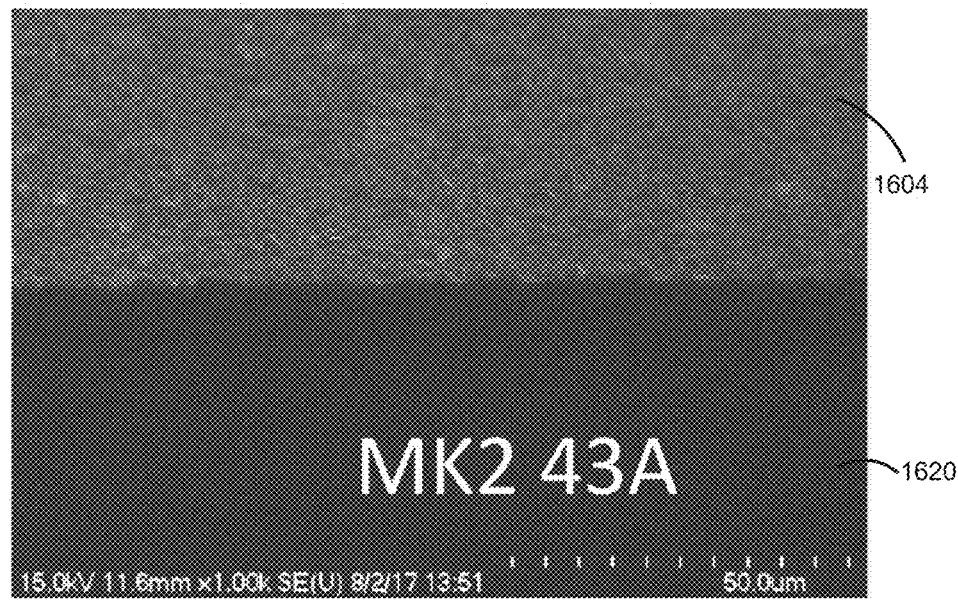
FIGS. 16A-16D illustrate, respectively, a scanning electron microscope perspective top view, a magnified scanning electron microscope side view, a magnified scanning electron microscope side view, and an even more magnified scanning electron microscope side view of an InP film grown on a Si structure substrate in accordance with an exemplary embodiment.
Figure 16B:
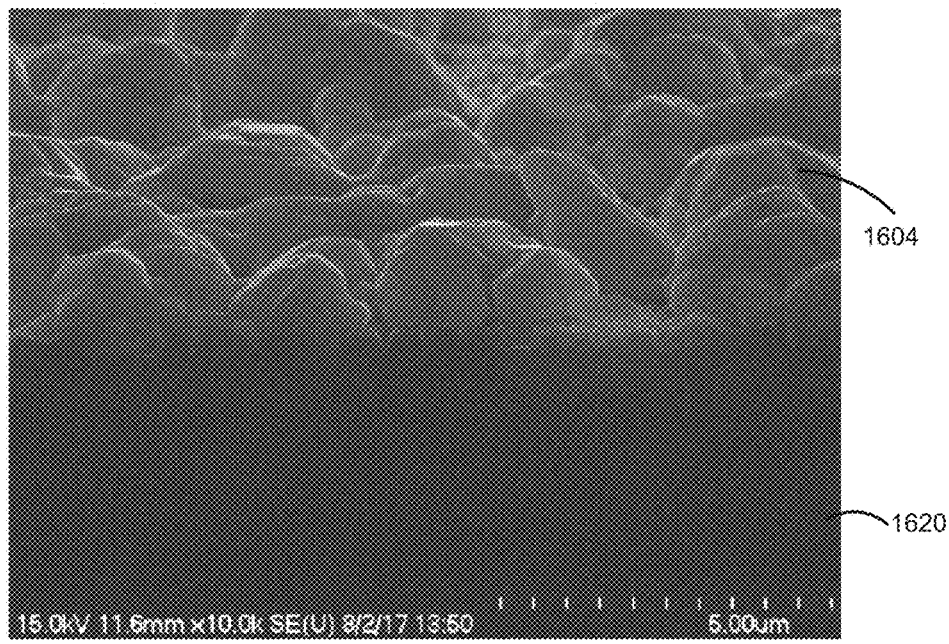
Figure 16C:
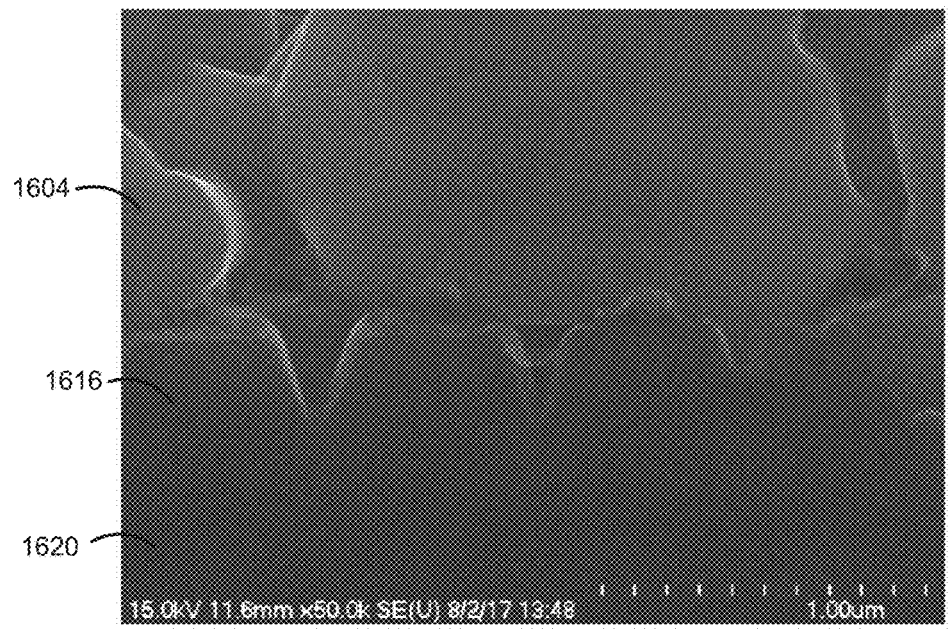
Figure 16D:
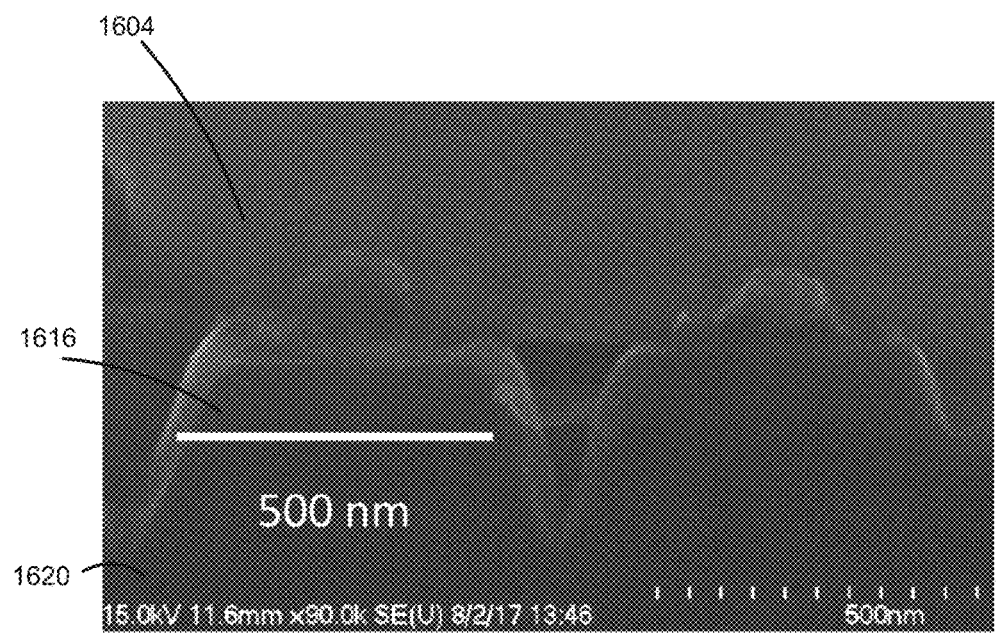

With reference to FIGS. 15A and 15B, a nanostructured substrate 1520 is illustrated. In various embodiments, nanostructured substrate 1520 comprises a Si substrate having a plurality of Si(100) nanopillars 1516. For example, nanopillars 1516 can comprise Si(100) nanopillars having an average diameter of approximately 400 nanometers and spaced approximately 500 nanometers apart, on average.

With reference to FIGS. 16A-16D, a film 1604 formed on a nanostructured substrate 1620 is illustrated. In various embodiments, film 1604 comprises an InP film grown on a Si(111) nanostructured substrate 1620. For example, nanostructured substrate 1620 can comprise a plurality of nanopillars 1616 having an average diameter of 500 nanometers. Film 1604 can, for example, be formed via chemical vapor deposition on nanostructured substrate 1620. In various embodiments, the chemical vapor deposition is performed under the following parameters: Tin is 965° C., Tp is between 505° C. to 540° C., and TSi is between 805° C. to 840° C. The growth time can be, for example, approximately 5 minutes. Further, nanopillars 1616 can be formed by etching nanostructured substrate 1620, for example, with 25 sccm of $Ar+H_2$ gas at a pressure of approximately 215 pascal.

Figure 17:
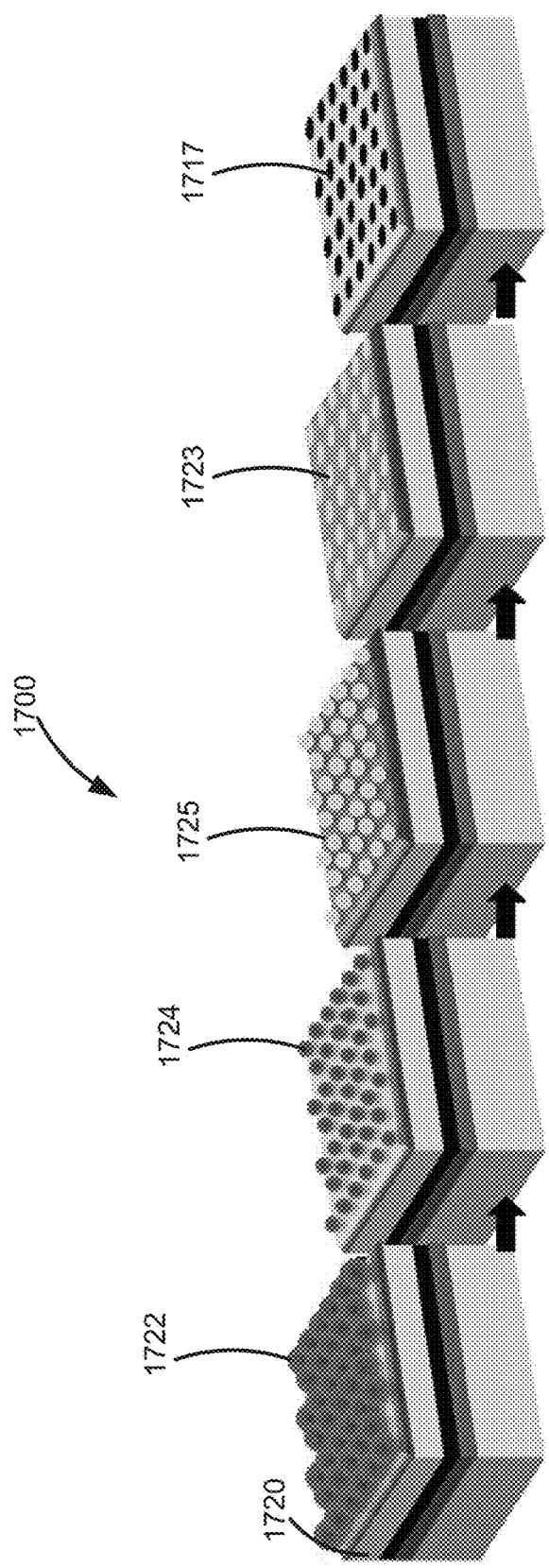
FIG. 17 illustrates stages of forming a nanostructured substrate in accordance with an exemplary embodiment.
Figure 18A:
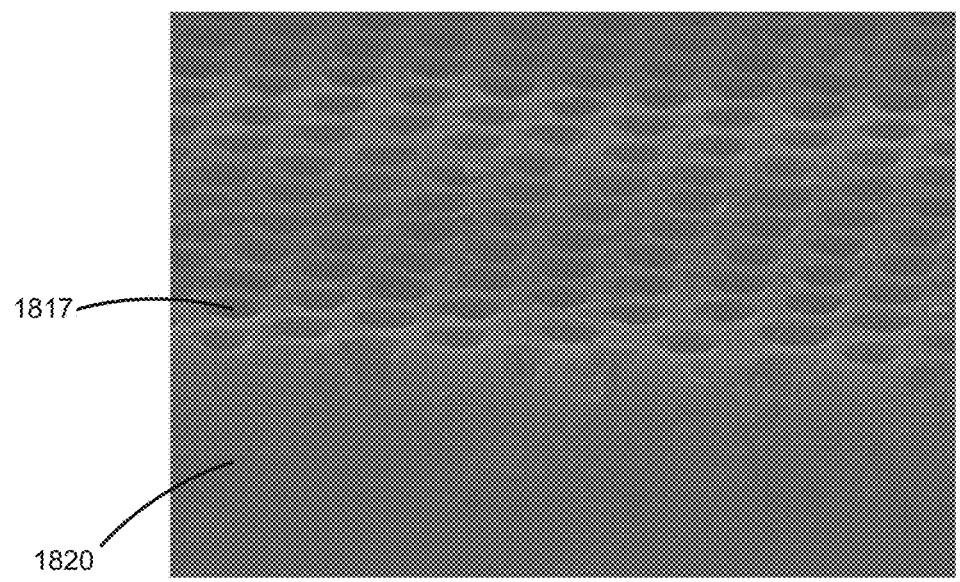
FIGS. 18A and 18B illustrate, respectively, a scanning electron microscope perspective view and a more magnified scanning electron microscope perspective view of a Si(100) substrate having a plurality of Si nanopores in accordance with an exemplary embodiment.
Figure 18B:
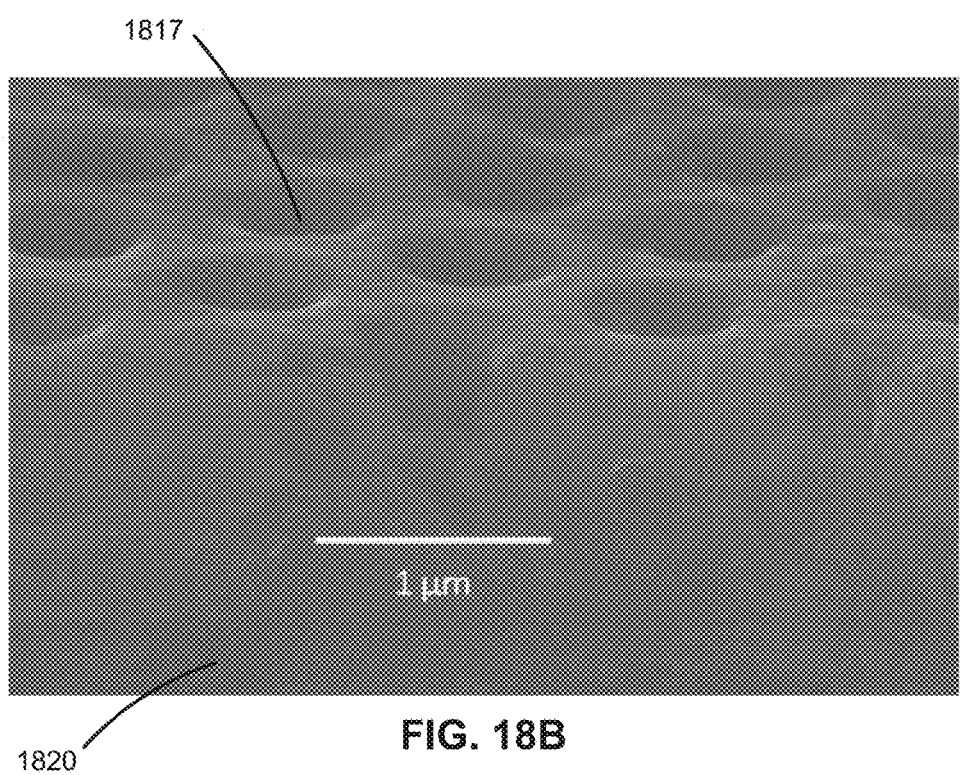
Figure 19A:
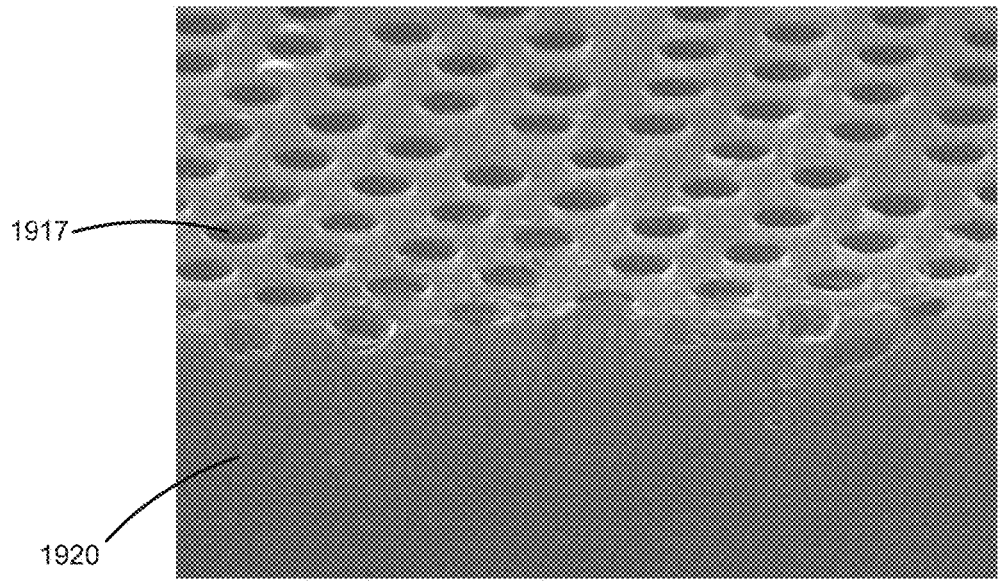
FIGS. 19A and 19B illustrate, respectively, a scanning electron microscope perspective view and a more magnified scanning electron microscope perspective side view of a Si(111) substrate having a plurality of Si nanopores in accordance with an exemplary embodiment.
Figure 19B:
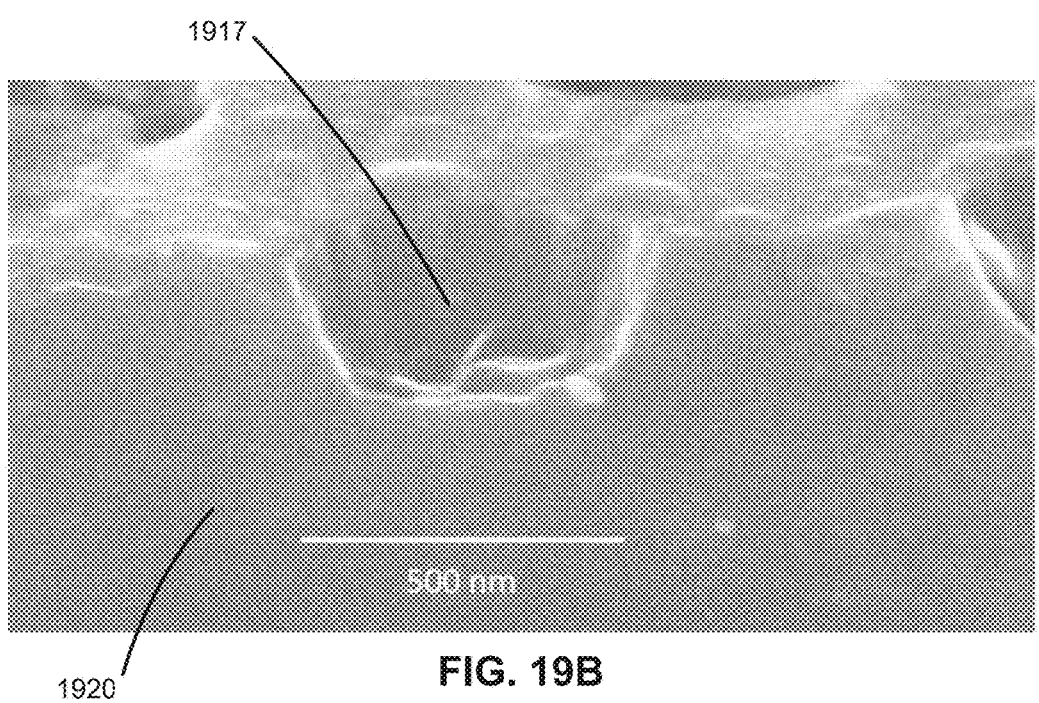

Turning now to FIG. 17, in various exemplary embodiments, principles of the present disclosure may be utilized to form surfaces configured with patterns of nanopores (as opposed to nanopillars). It will be appreciated that various surface characteristics may be obtained via production of nanopores as an alternative to nanopillars. In one exemplary embodiment, in an exemplary method 1700 nanospheres 1722 are deposited on a substrate 1720. Reactive ion etching may be performed to alter one or more characteristics of nanospheres 1722 to form adjusted nanospheres 1724, for example an alteration in size. Thereafter, a suitable mask 1725 may be deposited, for example a chrome-based mask. Adjusted nanospheres 1724 are then removed to reveal a series of holes 1723 in the mask. A plasma etch of the surface, or other suitable process, is then conducted to form a series of nanopores 1717.

In certain exemplary embodiments, inexpensive nanolithography techniques may be utilized to produce an ordered porous surface on an exemplary Ge or GaAs crystal for subsequent epitaxial growth of III-V solar cells. The nanostructured surface of the Ge or GaAs crystalline substrate is analogous to the porous Si layer on the single crystal Si in the case of epitaxial lift-off of Si solar cells. In addition, the etching-free epitaxial lift-off of III-V thin films from nanostructured Ge or GaAs substrates is made easier.

In some embodiments, InP is a material of choice because it is well known to have a low surface recombination velocity. In addition, InP can be used to form a solar cell using a simple process by forming a heterojunction with $TiO_2$. This process may be used to form solar cells based on InP grown on exemplary nanostructured substrates disclosed herein.

After a thin film is grown on an exemplary nanostructured substrate, the thin film may be lifted off (for example, via an adhesive or other suitable method). The nanostructured substrate may then be re-used to grow another thin film.

Principles of the present disclosure represent a stepping stone on a path towards the reduction of a solar module cost to $0.20/$W_p$, which is below the DOE target of <$0.3/$W_p$ module cost for a module conversion efficiency of 30% (assuming a 30 year lifetime and 2%/year conversion efficiency degradation), helping to achieve a levelized cost of energy of $0.02-0.03/kWh by 2030.

While the principles of this disclosure have been shown in various embodiments, many modifications of structure, arrangements, proportions, the elements, materials and components, used in practice, which are particularly adapted for a specific environment and operating requirements may be used without departing from the principles and scope of this disclosure. These and other changes or modifications are intended to be included within the scope of the present disclosure.

The present disclosure has been described with reference to various embodiments. However, one of ordinary skill in the art appreciates that various modifications and changes can be made without departing from the scope of the present disclosure. Accordingly, the specification is to be regarded in an illustrative rather than a restrictive sense, and all such modifications are intended to be included within the scope of the present disclosure. Likewise, benefits, other advantages, and solutions to problems have been described above with regard to various embodiments. However, benefits, advantages, solutions to problems, and any element(s) that may cause any benefit, advantage, or solution to occur or become more pronounced are not to be construed as a critical, required, or essential feature or element.

As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. Also, as used herein, the terms "coupled," "coupling," or any other variation thereof, are intended to cover a physical connection, an electrical connection, a magnetic connection, an optical connection, a communicative connection, a functional connection, and/or any other connection.

What is claimed is:

1. A method for preparing thin film materials, the method comprising:
    forming a plurality of nanopillars on a crystalline semiconductor substrate;
    growing a first thin film atop the plurality of nanopillars to form a nanostructured substrate;
    separating the first thin film from the plurality of nanopillars via a first lift-off process;
    re-using the nanostructured substrate to grow a second thin film atop the plurality of nanopillars; and
    separating the second thin film from the plurality of nanopillars via a second lift-off process.

2. The method of claim 1, wherein the plurality of nanopillars comprise at least a III-V semiconductor material.

3. The method of claim 1, wherein the plurality of nanopillars are configured with a diameter between 50 nm and 900 nm, a height between 100 nm and 900 nm, and a spacing of between 10 nm and 500 nm.

4. The method of claim 1, wherein the first thin film is configured for use in a solar cell.

5. The method of claim 1, wherein the plurality of nanopillars provide strain relief for the first thin film during the growing the first thin film atop the plurality of nanopillars.

6. A method for preparing thin film materials, the method comprising:
    depositing a plurality of nanospheres on a top surface of a crystalline semiconductor substrate;
    forming a plurality of nanopillars in the crystalline semiconductor substrate via a first etching;
    removing the plurality of nanospheres from the crystalline semiconductor substrate;
    growing a first thin film atop the plurality of nanopillars to form a nanostructured substrate;
    separating the first thin film from the plurality of nanopillars via a first lift-off process;
    re-using the nanostructured substrate to grow a second thin film atop the plurality of nanopillars; and
    separating the second thin film from the plurality of nanopillars via a second lift-off process.

7. The method of claim 6, wherein the plurality of nanopillars are configured with a diameter between 50 nm and 900 nm, a height between 100 nm and 900 nm, and a spacing of between 10 nm and 500 nm.

8. The method of claim 6, wherein the first thin film is configured for use in a solar cell.

9. The method of claim 6, wherein the plurality of nanopillars provide strain relief for the first thin film during the growing the first thin film atop the plurality of nanopillars.

10. The method of claim 6, wherein the plurality of nanospheres comprises a pre-assembled template.

11. The method of claim 6, further comprising adjusting a size of the plurality of nanospheres via a plasma etching after the depositing the plurality of nanospheres.

12. The method of claim 11, wherein the adjusting the size of the plurality of nanospheres comprises reducing an average diameter of the plurality of nanospheres to between 0.5 microns and 1.5 microns.

13. The method of claim 6, wherein the crystalline semiconductor substrate comprises a III-V semiconductor material.

14. The method of claim 6, wherein the first etching comprises plasma etching using at least one of Ar, $BCl_3$, $Cl_2$, $O_2$, $CH_4$, or $H_2$.

* * * * *